(12) United States Patent
Toyotaka

(10) Patent No.: US 9,160,291 B2
(45) Date of Patent: Oct. 13, 2015

(54) SEMICONDUCTOR CIRCUIT HAVING SWITCHING ELEMENT, CAPACITOR AND OPERATIONAL AMPLIFIER CIRCUIT

(71) Applicant: Semiconductor Energy Laboratory Co., Ltd., Atsugi-shi, Kanagawa-ken (JP)

(72) Inventor: Kouhei Toyotaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/454,791

(22) Filed: Aug. 8, 2014

(65) Prior Publication Data

US 2014/0347129 A1 Nov. 27, 2014

Related U.S. Application Data

(62) Division of application No. 13/453,092, filed on Apr. 23, 2012, now Pat. No. 8,803,559.

(30) Foreign Application Priority Data

Apr. 28, 2011 (JP) ................................. 2011-101940

(51) Int. Cl.
*G11C 27/02* (2006.01)
*G06F 7/64* (2006.01)
(Continued)

(52) U.S. Cl.
CPC ............ *H03F 3/45071* (2013.01); *H03F 3/005* (2013.01); *H03F 3/45475* (2013.01); *H03F 2003/45008* (2013.01); *H03F 2203/45551* (2013.01)

(58) Field of Classification Search
CPC . H03F 3/005; H03F 3/45071; H03F 3/45475; H03F 2003/45008; H03F 2203/45551
USPC ............................... 327/94, 95, 337, 344, 345
See application file for complete search history.

(56) References Cited

U.S. PATENT DOCUMENTS 5,617,093 A 4/1997 Klein
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Kenneth B Wells
(74) *Attorney, Agent, or Firm* — Fish & Richardson P.C.

(57) ABSTRACT

A semiconductor circuit which can have stable input output characteristics is provided. Specifically, a semiconductor circuit in which problems caused by the leakage current of a switching element are suppressed is provided. A field-effect transistor in which a wide band gap semiconductor, such as an oxide semiconductor, is used in a semiconductor layer where a channel is formed is used for a switching element included in a switched capacitor circuit. Such a transistor has a small leakage current in an off state. When the transistor is used as a switching element, a semiconductor circuit which has stable input output characteristics and in which problems caused by the leakage current are suppressed can be fabricated.

6 Claims, 11 Drawing Sheets

(51) Int. Cl.
*H03F 3/45* (2006.01)
*H03F 3/00* (2006.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,072,193 | B2 | 7/2006 | Lin |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,626,524 | B2 | 12/2009 | Horie |
| 7,674,650 | B2 | 3/2010 | Akimoto et al. |
| 7,724,041 | B2 | 5/2010 | Draxelmayr |
| 7,732,819 | B2 | 6/2010 | Akimoto et al. |
| 7,791,074 | B2 | 9/2010 | Iwasaki |
| 7,834,685 | B1 | 11/2010 | Pertijs |
| 8,040,264 | B2 | 10/2011 | Hummerston et al. |
| 8,076,948 | B2 | 12/2011 | Knoedgen et al. |
| 8,368,430 | B2 | 2/2013 | Watanabe |
| 8,415,731 | B2 | 4/2013 | Yamazaki et al. |
| 8,437,165 | B2 | 5/2013 | Yamazaki et al. |
| 8,471,256 | B2 | 6/2013 | Yamazaki et al. |
| 8,497,746 | B2 | 7/2013 | Visconti et al. |
| 8,502,226 | B2 | 8/2013 | Kondo et al. |
| 8,803,559 | B2 * | 8/2014 | Toyotaka ................. 327/94 |
| 8,941,958 | B2 | 1/2015 | Tomatsu |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0089927 | A1 | 4/2011 | Yamazaki et al. |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 06-301800 | A | 10/1994 |
| JP | 08-264794 | A | 10/1996 |
| JP | 11-505377 | | 5/1999 |
| JP | 11-234088 | A | 8/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| WO | WO-2004/114391 | | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID Inter-

(56) References Cited

OTHER PUBLICATIONS national Symposium Digest of Technical Papers, May 31, 2009, pp. 280-283.

Clark.S et al. "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Hayashi.R et al., "42.1: Invited Paper: Improved Amorphous In-Ga-Zn-O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17- 22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers. 2004, vol. 35. pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87. pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials). 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009; pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000°C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003; vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size Amoled Displays", IDW '08 : Proceedings of the 6th International Display Workshops. Dec. 3, 2008; pp. 581-584.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995. vol. 150. pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) . Sep. 13, 2004, vol. 85, No. 11, pp. 1993-1995.

(56) References Cited

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem Oleds", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12. pp. H1009-H1014.
Ohara.H at al., "21.3:4.0 In. QVGA AMOLED Display Using In-Ga-Zn-Oxide TFTS With a Novel Passivation Layer", SID Digest '09 : SID International Symposium Digest of Technical Papers, May 31, 2009, pp. 284-287.
Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.
Osada.T et al., "Development of Driver-Integrated Panel Using Amorphous In-Ga-Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size Amoled", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92. pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by AR Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In-Ga-Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3-In2O3-ZnO)TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Razavi Behzad, "Chapter 12 Introduction to Switched-Capacitor Circuits", Design of Analog CMOS Integrated Circuits, Aug. 15, 2000, pp. 405-409, Mc Graw Hill.

* cited by examiner

600(a)  601(a)

600(a)  601(a)  602(a)

603(a)
600(a)  601(a)  602(a)

603(a)
605a(a)      605b(a)
600(a)  601(a)  602(a)

606(a)  608(a)  603(a)
605a(a)                605b(a)
600(a)  601(a)  602(a)

charge 0 charge +1 charge 0 charge −1 charge 0

● In
☾ Sn
☽ Zn
• O

- In
- Ga
- Zn
- O

US 9,160,291 B2

SEMICONDUCTOR CIRCUIT HAVING SWITCHING ELEMENT, CAPACITOR AND OPERATIONAL AMPLIFIER CIRCUIT

CROSS-REFERENCE TO RELATED APPLICATIONS

This application is a divisional of U.S. application Ser. No. 13/453,092, filed Apr. 23, 2012, now U.S. Pat. No. 8,803,559, issued Aug. 12, 2014, which claims the benefit of a foreign priority application filed in Japan as Serial No. 2011-101940 on Apr. 28, 2011, both of which are incorporated by reference.

BACKGROUND OF THE INVENTION

1. Field of the Invention

The present invention relates to a semiconductor circuit using a semiconductor element.

2. Description of the Related Art

As one of techniques of a semiconductor circuit, a technique of a switched capacitor circuit has been known in which a switching element (hereinafter also referred to as a switch) is combined with a capacitor and the switching element controls charge and discharge of the capacitor. Since temperature dependence of the electric characteristics of such a switched capacitor circuit is very small, the switched capacitor circuit can be replaced with a resistor in a semiconductor circuit to fabricate a semiconductor circuit having small temperature dependence.

In addition, a technique of using a combination of a switched capacitor circuit and an operational amplifier circuit has been known. When such a semiconductor circuit including a combination of a switched capacitor circuit and an operational amplifier circuit is operated with the use of a clock signal, the semiconductor circuit samples a continuous time signal, which is input to the semiconductor circuit, converts the continuous time signal into a discrete time signal, and outputs the discrete time signal. Depending on the connection method and the operation method, a switched capacitor circuit and an operational amplifier circuit can constitute a circuit such as a filter circuit, an amplifier circuit, an integrating circuit, and a differentiating circuit.

For example, an amplifier (amp) including a combination of these is called a switched capacitor amplifier circuit (see Non-Patent Document 1).

FIG. 11 shows an example of a structure of a switched capacitor amplifier circuit described in Non-Patent Document 1. The switched capacitor amplifier circuit includes three switches (a switch SW1, a switch SW2, and a switch SW3), two capacitors (a capacitor C1 and a capacitor C2), and one operational amplifier circuit. An input signal IN is input to an input terminal of the switched capacitor amplifier circuit. An output signal OUT is output to an output terminal. Here, the voltage of the input signal IN is an input voltage Vin and the voltage of the output signal OUT is an output voltage Vout. The same clock signals S1 are input to the switch SW1 and the switch SW2, and a clock signal S2 having a phase opposite to that of the clock signal S1 is input to the switch SW3. Here, a ground voltage is Vref. A node between the switch SW1 and the capacitor C1 is called a node (A), and a node connected to a minus terminal of the operational amplifier circuit is called a node (B).

There are two periods in the operation of the switched capacitor amplifier circuit, that is, a sampling period during which the input voltage Vin is sampled and a hold period during which the sampled input voltage Vin is amplified and output as the output voltage Vout. As an example, operation of the switched capacitor amplifier circuit shown in FIG. 11 in each period will be described below.

First, in the sampling period, the clock signals S1 and the clock signal S2 are input to turn on the switch SW1 and the switch SW2 and turn off the switch SW3. At this time, when the capacitance of the capacitor C1 is C1, the capacitance of the capacitor C2 is C2, a charge accumulated in an electrode of the capacitor C1 on the node (B) side is Q1, and a charge accumulated in an electrode of the capacitor C2 on the node (B) side is Q2, Q1 and Q2 are expressed by a formula 1.

$$Q1 = C1 \times (Vref - Vin)$$

$$Q2 = C2 \times (Vref - Vref) = 0 \qquad \text{[Formula 1]}$$

Next, in the hold period, the clock signals S1 and the clock signal S2 are input to turn off the switch SW1 and the switch SW2 and to turn on the switch SW3. At this time, the potential of the node (B) does not change because the node (B) is virtually grounded by the operational amplifier circuit. Therefore, when a charge accumulated in an electrode of the capacitor C1 on the node (B) side at this time is Q1' and a charge accumulated in an electrode of the capacitor C2 on the node (B) side at this time is Q2', Q1' and Q2' are expressed by a formula 2.

$$Q1' = C1 \times (Vref - Vref) = 0$$

$$Q2' = C2 \times (Vref - Vout) \qquad \text{[Formula 2]}$$

Here, the output voltage Vout is expressed by a formula 3 when it is calculated on the assumption that the total amount of charges accumulated in the capacitors in the sampling period is equal to that in the hold period.

$$Vout = \frac{C1}{C2}(Vin - Vref) + Vref \qquad \text{[Formula 3]}$$

As described above, in the switched capacitor amplifier circuit, the input voltage Vin obtained in the sampling period can be amplified depending on the capacitance ratio between the capacitor C1 and the capacitor C2 and can be output in the hold period.

REFERENCE

Non-Patent Document

[Non-Patent Document 1] "Design of Analog CMOS Integrated Circuits (Application)", Behzad Razavi (supervised and translated by Tadahiro Kuroda), MARUZEN PUBLISHING CO., LTD (2003), pp. 495-498.

SUMMARY OF THE INVENTION

In many cases, a conventional analogue switch using a CMOS technique is used as a switch included in a switched capacitor circuit of the above semiconductor circuit. However, a leakage current is generated even in an off state of such an analogue switch, so that the input output characteristics of the semiconductor circuit are degraded owing to this leakage current in some cases. For example, there are the following problems in output characteristics caused by the leakage current in the above-described conventional switched capacitor amplifier circuit.

First, attention is focused on the switch SW1. The input voltage Vin is constantly input to the input terminal to which the input signal IN is input; therefore, when a leakage current is generated in the switch SW1 in an off state, the potential of the node (B) is not stable in the hold period. Consequently, noise due to the input voltage Vin is added to the output voltage Vout.

Next, attention is focused on the switch SW2. A charge accumulated in the capacitor C2 in the hold period decreases because the switch SW2 serves as a leakage path. As a result, the decrease of the charge is observed as a change in the output voltage Vout, so that the output voltage Vout cannot be stable.

In order to reduce such an influence of leakage currents of the switches included in the switched capacitor amplifier circuit, capacitance of the capacitor C1 and the capacitor C2 are increased. However, such a countermeasure leads to problems in that the layout size of the circuit is increased, and the circuit is incapable of high-speed operation since long time is required for charging and discharging the capacitor.

Occurrence of such problems caused by the leakage current of a switching element are not limited to the switched capacitor amplifier circuit described as an example in the above, and for example, the problems occur also in a semiconductor circuit including a combination of a switched capacitor circuit and an operational amplifier circuit, such as an amplifier circuit, an integrating circuit, or a filter circuit.

That is, noise is added to a discrete time signal that is an output signal owing to the leakage current of the switching element connected to a terminal to which a continuous time signal is input as an input signal of the semiconductor circuit. Further, a stable output voltage as an output signal cannot be obtained because of the leakage current of the switching element connected to the capacitor.

The present invention is made in view of the foregoing technical background. Therefore, an object of one embodiment of the present invention is to provide a semiconductor circuit with stable input output characteristics. Specifically, an object is to provide a semiconductor circuit with which fewer problems due to a leakage current of a switching element arise.

An embodiment of the present invention achieves at least one of the above objects.

In one embodiment of the present invention, a switching element having extremely small leakage current in an off state is used for a semiconductor circuit to solve the problems. Specifically, a field-effect transistor in which a wide band gap semiconductor, such as an oxide semiconductor, is used in a semiconductor layer where a channel is formed is used for the switching element. Such a transistor has a small leakage current in an off state. When the transistor is used as a switching element, a semiconductor circuit in which problems caused by the leakage current are suppressed and which has stable input output characteristics can be fabricated.

In addition, an oxide semiconductor having extremely low intrinsic carrier density is preferably used as a semiconductor included in the transistor. Since the intrinsic carrier density of the semiconductor layer where the channel is formed is extremely low, the leakage current of the transistor in an off state is extremely small. Such a feature is unique to an oxide semiconductor and other semiconductors (e.g., silicon) do not have such a feature.

One embodiment of the present invention is a semiconductor circuit including at least one switched capacitor circuit having a switching element and a capacitor connected in parallel or series to each other, and an operational amplifier circuit. The semiconductor circuit samples an input signal and outputs a discrete time signal. The switching element includes a field-effect transistor whose leakage current in an off state is less than or equal to $1 \times 10^{-17}$ A per channel width of 1 μm.

In the semiconductor circuit with the above structure, a transistor having extremely small off-state current and including an oxide semiconductor is used for the switching element of the switched capacitor circuit included in the semiconductor circuit. Thus, a decrease in charges accumulated in the capacitor connected to the switching element through the switching element in an off state is suppressed. Consequently, the semiconductor circuit including such a switched capacitor circuit can have stable input output characteristics. Extremely stable input output characteristics obtained by using such a transistor having extremely small leakage current in an off state cannot be obtained by a conventional transistor using silicon.

Further, one embodiment of the present invention is a semiconductor circuit including: an operational amplifier circuit; a first switching element connected to one input terminal of the operational amplifier circuit through a first capacitor; a second capacitor connected between the one input terminal and an output terminal of the operational amplifier circuit; a second switching element connected between the one input terminal and the output terminal of the operational amplifier circuit; and a third switching element including one electrode connected between the first switching element and the first capacitor and the other electrode to which a reference voltage is input. The reference voltage is input to the other input terminal of the operational amplifier circuit. The first switching element and the second switching element each include a field-effect transistor whose leakage current in an off state is less than or equal to $1 \times 10^{-17}$ A per channel width of 1 μm.

With such a structure, input of noise to an output signal, which is output during a hold period, due to an input signal is greatly suppressed, so that the switched capacitor amplifier circuit can have stable input output characteristics. Further, a decrease in charges accumulated in the second capacitor during the hold period is suppressed, so that change in output characteristics over time is suppressed.

Further, one embodiment of the present invention is a semiconductor circuit including: an operational amplifier circuit; a first switching element connected to one input terminal of the operational amplifier circuit through a first capacitor; a second capacitor connected between the one input terminal and an output terminal of the operational amplifier circuit; a second switching element connected between the one input terminal and the output terminal of the operational amplifier circuit; a third switching element connected to the other input terminal of the operational amplifier circuit through a third capacitor; a fourth capacitor connected between the other input terminal and the output terminal of the operational amplifier circuit; and a fourth switching element connected between the other input terminal and the output terminal of the operational amplifier circuit. The first switching element, the second switching element, the third switching element, and the fourth switching element each include a field-effect transistor whose leakage current in an off state is less than or equal to $1 \times 10^{-17}$ A per channel width of 1 μm.

With such a structure, a differential switched capacitor amplifier circuit which has stable input output characteristics and in which a reference voltage is unnecessary can be fabricated. Since the reference voltage is unnecessary, another circuit for generating the reference voltage is not needed; thus, a structure of a semiconductor device using the switched capacitor amplifier circuit can be simple.

Furthermore, one embodiment of the present invention is a semiconductor circuit including: an operational amplifier circuit; a first switching element connected to one input terminal of the operational amplifier circuit; a second switching element connected to the first switching element through a first capacitor; a second capacitor connected between the one input terminal and an output terminal of the operational amplifier circuit; a third switching element including one electrode connected between the first capacitor and the second switching element and the other electrode to which a reference voltage is input; and a fourth switching element including one electrode connected between the first capacitor and the first switching element and the other electrode to which the reference voltage is input. The reference voltage is input to the other input terminal of the operational amplifier circuit. The first switching element and the second switching element each include a field-effect transistor whose leakage current in an off state is less than or equal to $1\times10^{-17}$ A per channel width of 1 μm.

With such a structure, input of noise to an output signal, which is output during a hold period, due to an input signal is greatly suppressed, so that a switched capacitor integrating circuit with stable input output characteristics can be provided.

Further, the field-effect transistor preferably includes an oxide semiconductor in a semiconductor layer in which a channel is formed.

Note that in this specification and the like, a switched capacitor circuit includes at least one switching element and at least one capacitor, which are connected in parallel or series to each other, and is a circuit in which charge and discharge of the capacitor is controlled by a switching operation of the switching element.

According to one embodiment of the present invention, a semiconductor circuit which can have stable input output characteristics can be provided. Specifically, a semiconductor circuit in which problems caused by a leakage current of a switching element are suppressed can be provided.

DETAILED DESCRIPTION OF THE INVENTION

Figure 1:
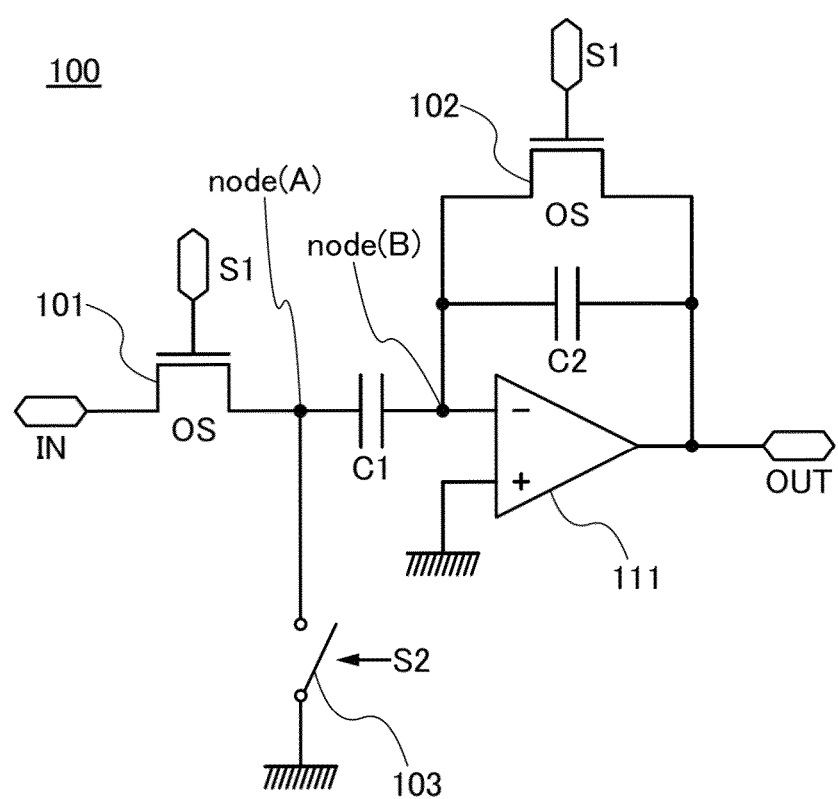
FIG. 1 shows a semiconductor circuit that is one embodiment of the present invention.

Embodiments will be described in detail with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Each object therefore is not necessarily in such scales.

A transistor is a kind of semiconductor elements and capable of amplifying a current or a voltage or switching operation for controlling conduction or non-conduction, or the like. A transistor in this specification includes an insulated-gate field effect transistor (IGFET) and a thin film transistor (TFT).

Functions of a "source" and a "drain" are sometimes replaced with each other when a transistor of opposite polarity is used or when the direction of current flow is changed in circuit operation, for example. Therefore, the terms "source" and "drain" can be used to denote the drain and the source, respectively, in this specification.

In this specification and the like, one of a source and a drain of a transistor is called a "first electrode" and the other of the source and the drain is called a "second electrode" in some cases. Note that a gate is called a "gate" or a "gate electrode" in such a case.

In this specification and the like, the term "electrically connected" includes the case where components are connected through an "object having any electric function". There is no particular limitation on an "object having any electric function" as long as electric signals can be transmitted and received between components that are connected through the object. Examples of an "object having any electric action" include a switching element such as a transistor, a resistor, a coil, a capacitor, and an element with a variety of functions in addition to an electrode and a wiring.

A node in this specification and the like means an element (e.g., a wiring) which enables electric connection between elements included in a circuit. Therefore, a "node to which A is connected" is a wiring which is electrically connected to A and can be regarded as having the same potential as A. Note that even when one or more elements which enable electrical connection (e.g., switches, transistors, capacitors, inductors, resistors, or diodes) are inserted in a portion of the wiring, the wiring can be regarded as the "node to which A is connected" as long as it has the same potential as A.

Embodiment 1

In this embodiment, a structural example and a circuit operation of a semiconductor circuit that is one embodiment of the present invention will be described with reference to FIG. 1, FIG. 2, FIG. 3, and FIG. 4.

Structural Example

FIG. 1 shows a circuit diagram of a switched capacitor amplifier circuit 100 described as an example in this embodiment. The switched capacitor amplifier circuit 100 with this structure is an amplifier circuit which amplifies the voltage amplitude of a continuous time signal input as an input signal IN and outputs a discrete time signal as an output signal OUT.

The switched capacitor amplifier circuit 100 includes three switching elements (a transistor 101, a transistor 102, and a switch 103), two capacitors (a capacitor C1 and a capacitor C2), and an operational amplifier circuit 111.

A first electrode of the transistor 101 is connected to an input terminal to which the input signal IN is input, and a second electrode of the transistor 101 is connected to a first terminal of the capacitor C1 and a first electrode of the switch 103. A second terminal of the capacitor C1 is connected to a minus terminal of the operational amplifier circuit 111, a first terminal of the capacitor C2, and a first electrode of the transistor 102. A second electrode of the transistor 102 is connected to a second terminal of the capacitor C2, an output terminal of the operational amplifier circuit 111, and an output terminal of the switched capacitor amplifier circuit 100 to which an output signal OUT is output. A second electrode of the switch 103 and a plus terminal of the operational amplifier circuit 111 are grounded.

The operational amplifier circuit 111 is one of differential amplifier circuits that operate with a potential difference between two input terminals, and various kinds of operation amplifiers can be used, for example. The operational amplifier circuit 111 may include an n-channel transistor and a p-channel transistor.

Here, a node between the transistor 101 and the capacitor C1 is a node (A), and a node connected to the minus terminal of the operational amplifier circuit 111 is a node (B).

The same clock signals S1 are input to a gate of the transistor 101 and a gate of the transistor 102, and a clock signal S2 having a phase opposite to that of the clock signal S1 is input to the switch 103. Here, the high-level potential of each of the clock signals input to the gates of the transistors preferably has a value which turns on the transistors satisfactorily, i.e., a value with which the transistors operate in the linear region regardless of the input voltage. When the transistor is operated with such a voltage, drop of a voltage input through the transistor due to the influence of the threshold voltage of the transistor can be suppressed. Hereinafter description is made assuming that a voltage drop due to the threshold voltage of the transistor is negligible.

The transistors 101 and 102 are n-channel transistors.

Here, for example, a transistor using a semiconductor with a wider band gap than silicon in a semiconductor layer where a channel is formed can be used as each of the transistor 101 and the transistor 102. For example, a semiconductor with a band gap greater than or equal to 2.0 eV, preferably greater than or equal to 2.5 eV, more preferably greater than or equal to 3.0 eV can be used. An oxide semiconductor is preferably used as such a semiconductor.

The transistor including the oxide semiconductor has a small leakage current (hereinafter also referred to as an off-state current) in an off state. The off-state current per micrometer of channel width is lower than or equal to 10 aA ($1 \times 10^{-17}$ A), preferably lower than or equal to 1 aA ($1 \times 10^{-18}$ A), more preferably lower than or equal to 10 zA ($1 \times 10^{-20}$ A), further preferably lower than or equal to 1 zA ($1 \times 10^{-21}$ A), still further preferably lower than or equal to 100 yA ($1 \times 10^{-22}$ A).

A transistor using a known semiconductor material such as silicon can be used as the switch 103. Note that the switch 103 may be formed using a semiconductor material similar to those of the transistors 101 and 102. When the switch 103 is formed using a semiconductor material similar to those of the transistors 101 and 102, the manufacturing steps can be simple. Further, as described as an example in Embodiment 3, an area of the circuit can be reduced in such a manner that the switch 103 is formed using a semiconductor material such as silicon and the transistors 101 and 102 are formed over the switch 103.

<Example of Circuit Operation>

An example of a circuit operation of the switched capacitor amplifier circuit 100 will be described below with reference to FIG. 1 and FIG. 2. Note that part of the description, which is in common with the description of the related art is not repeated in some cases.

Here, there are two periods, i.e., a sampling period and a hold period in the operation of the switched capacitor amplifier circuit 100. In the sampling period, the switched capacitor amplifier circuit 100 samples an input voltage Vin of the input signal IN. In the hold period, the switched capacitor amplifier circuit 100 can output the output signal OUT having an output voltage Vout, which is amplified based on an amplifier ratio determined by the capacitance ratio between the capacitor C1 and the capacitor C2.

Figure 2:
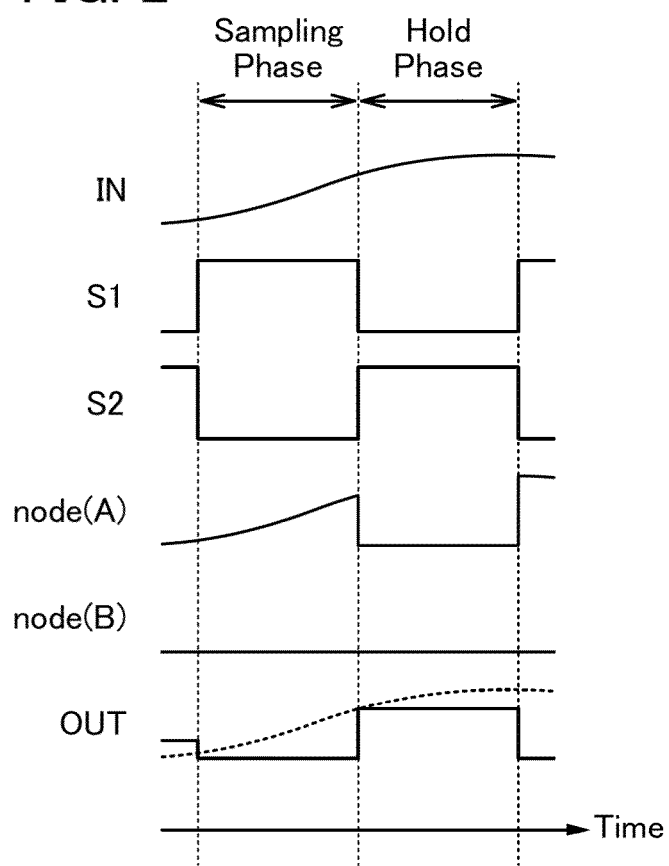
FIG. 2 shows an operation of a semiconductor circuit that is one embodiment of the present invention.

FIG. 2 is an example of a timing chart of the circuit operation of the switched capacitor amplifier circuit 100. FIG. 2 shows a change over time in the voltage of each of the input signal IN, the clock signal S1, the clock signal S2, the node (A), the node (B), and the output signal OUT, which are shown in FIG. 1.

Here, a switch described in this specification and the like turns on when a high-level potential is input as a clock signal and turns off when a low-level potential is input as a clock signal.

First, in the sampling period, a high-level potential is input as the clock signal S1 and a low-level potential is input as the clock signal S2. That is, in the sampling period, the transistors 101 and 102 are turned on and the switch 103 is turned off.

Thus, in the sampling period, the input voltage Vin is input to the node (A) through the transistor 101. On the other hand, the potential of the node (B) and the potential of the output signal OUT are both grounded.

Next, in the hold period, a low-level potential is input as the clock signal S1 and a high-level potential is input as the clock signal S2. That is, in the hold period, the transistors 101 and 102 are turned off and the switch 103 is turned on.

Thus, in the hold period, a ground potential is input to the node (A) through the switch 103. The node (B) is virtually grounded, so that the node (B) holds a ground potential. The output voltage Vout obtained by amplifying the input voltage Vin, which is in the state just before the hold period, based on the capacitance ratio between the capacitor C1 and the capacitor C2 is output as the output signal OUT.

Here, when attention is focused on the transistor 101 in the hold period, although the input voltage Vin is constantly input from a terminal which is connected to the first electrode of the transistor 101 and to which the input signal IN is input, the node (A) and the input terminal are almost completely insulated from each other because the off-state current of the transistor 101 is extremely small. Thus, input of amplitude of the input voltage Vin as noise to the node (A) is greatly suppressed, so that the potential of the node (A) is kept stable. Therefore, the potential of the node (B) which is capacitively coupled with the node (A) through the capacitor C1 is also kept stable; consequently, the output signal OUT can have the stable output voltage Vout.

When attention is focused on the transistor 102 in the hold period, similarly to the capacitor C2, the transistor 102 is kept in the state where the voltage of the output voltage Vout is applied between the first electrode and the second electrode. Here, since the off-state current of the transistor 102 is extremely small, the output terminal of the switched capacitor amplifier circuit 100 to which the output signal OUT is output and the node (B) are almost completely insulated from each other, and the potential of the output voltage Vout is kept extremely stable.

Consequently, with such a structure, problems caused by the leakage current of the switching element can be suppressed, and the switched capacitor amplifier circuit 100 can have stable input output characteristics.

Further, in a conventional switched capacitor amplifier circuit, in consideration of the off-state current of a switching element connected to the capacitor C2 in parallel, capacitance of each of the capacitor C1 and the capacitor C2 needs to be designed to be large in advance in order to stabilize the output voltage Vout. However, in the switched capacitor amplifier circuit 100 with this structure, a capacitor with extremely small capacitance can be used for each of the capacitor C1 and the capacitor C2 because the off-state current of the transistor 102 connected to the capacitor C2 in parallel is extremely small. Further, for example, it is possible to utilize capacitance between wirings, in which case another capacitor is unnecessary. Thus, the layout size of a switched capacitor amplifier circuit including the above-described transistor with extremely small off-state current can be small compared to the conventional switched capacitor amplifier circuit.

Modification Example 1

A structural example of a circuit different from that described as an example in the above will be described below.

Figure 3:
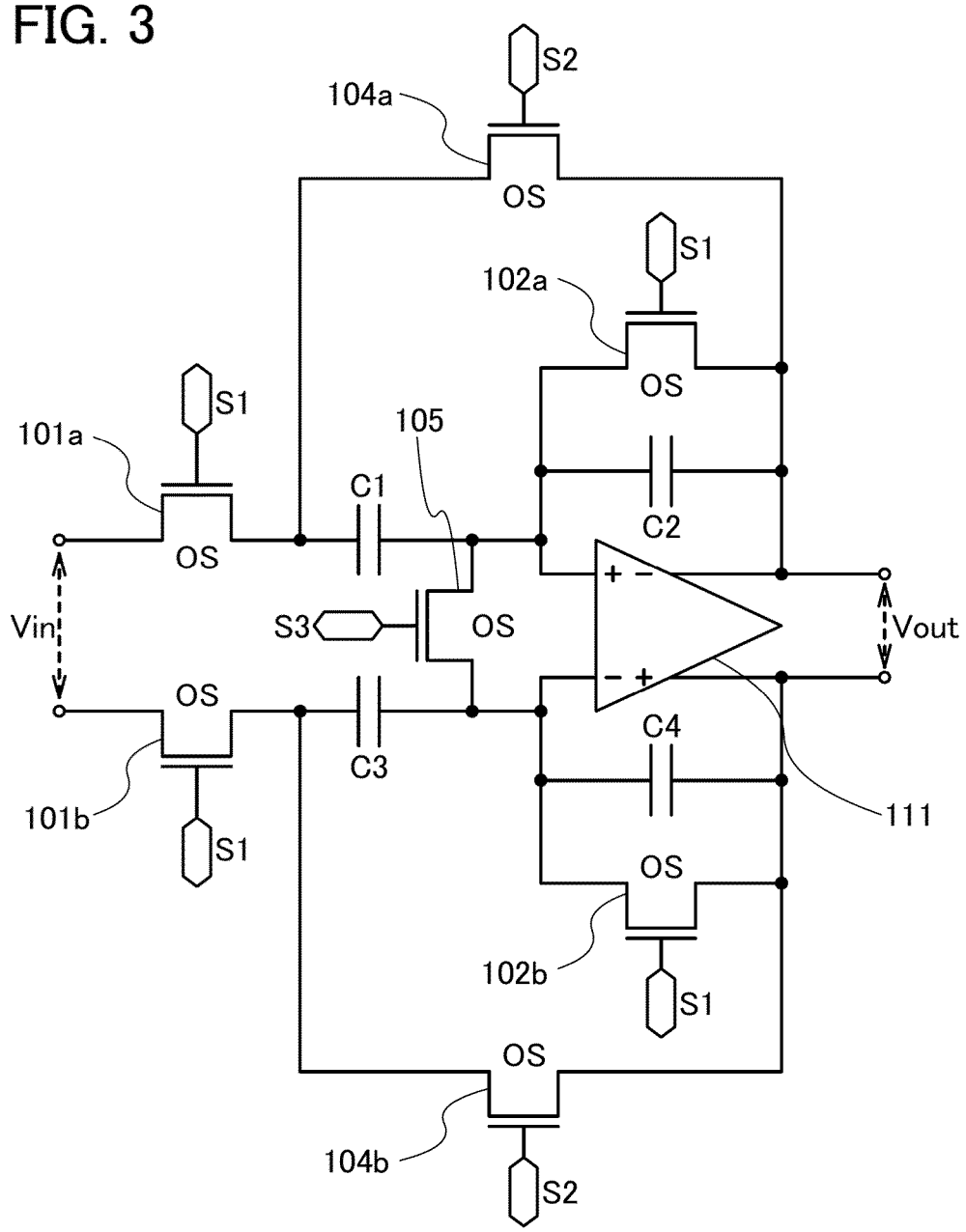
FIG. 3 shows a semiconductor circuit that is one embodiment of the present invention.

A switched capacitor amplifier circuit shown in FIG. 3 is a differential switched capacitor amplifier circuit which does not use a reference potential (ground voltage).

A second electrode of a transistor 101a is connected to a plus terminal of the operational amplifier circuit 111 through the capacitor C1. Further, the plus terminal and a minus output terminal of the operational amplifier circuit 111 are each connected in parallel to the capacitor C2 and a transistor 102a. A first electrode of a transistor 104a is connected to a node between the transistor 101a and the capacitor C1, and a second electrode of the transistor 104a is connected to the minus output terminal of the operational amplifier circuit 111.

Further, a minus terminal of the operational amplifier circuit 111 is connected to a second electrode of a transistor 101b through a capacitor C3. The minus terminal and a plus output terminal of the operational amplifier circuit 111 are each connected in parallel to a capacitor C4 and a transistor 102b. A first electrode of a transistor 104b is connected to a node between the transistor 101b and the capacitor C3, and a second electrode of the transistor 104b is connected to the plus output terminal of the operational amplifier circuit 111.

Further, a first electrode and a second electrode of a transistor 105 are connected to a node between the capacitor C1 and the operational amplifier circuit 111 and a node between the capacitor C3 and the operational amplifier circuit 111, respectively.

An input signal is input between a node to which a first electrode of the transistor 101a is connected and a node to which a first electrode of the transistor 101b is connected so that the potential difference therebetween becomes the input voltage Vin. Further, the potential difference between the minus output terminal and the plus output terminal of the operational amplifier circuit 111 becomes the output voltage Vout.

Here, the clock signal S1 is input to a gate of each of the transistor 101a, the transistor 101b, the transistor 102a, and the transistor 102b. Further, the clock signal S2 is input to a gate of each of the transistor 104a and the transistor 104b. A clock signal S3 is input to a gate of the transistor 105.

Here, the transistor 105 is provided to serve a function of resetting the potentials of the plus terminal and the minus terminal in the operational amplifier circuit 111 so that both the terminals have the same potentials, and a reset period during which the potentials are reset is controlled by the clock signal S3.

A period during which a high-level potential is input as the clock signal S1 is a sampling period and a period during which a high-level potential is input as the clock signal S2 is a hold period. A period during which a high-level potential is input as the clock signal S3 is a reset period. Here, it is sufficient that the reset period is set so as not to overlap with the hold period, and the reset period may be set just before the sampling period and may be set so as to overlap with the sampling period.

With a differential switched capacitor amplifier circuit having such a structure, offset voltage due to variation in the electric characteristics of transistors can be reduced, so that input output characteristics with high accuracy can be obtained.

Here, in this structure, the transistor with extremely small off-state current described as an example in the above is used as each of the transistor 101a, the transistor 101b, the transistor 102a, the transistor 102b, the transistor 104a, the transistor 104b, and the transistor 105. Consequently, problems caused by the leakage current of the switching element in the switched capacitor amplifier circuit having this structure are solved and stable input output characteristics can be obtained.

Modification Example 2

A structure including a combination of the transistor with extremely small off-state current described as an example in the above, a capacitor, and an operational amplifier circuit can be used for a semiconductor circuit such as a filter circuit or an integrating circuit in addition to an amplifier circuit such as a switched capacitor amplifier circuit. The case of using the transistor with extremely small off-state current described as an example in the above for a switched capacitor integrating circuit will be described below.

Figure 4:
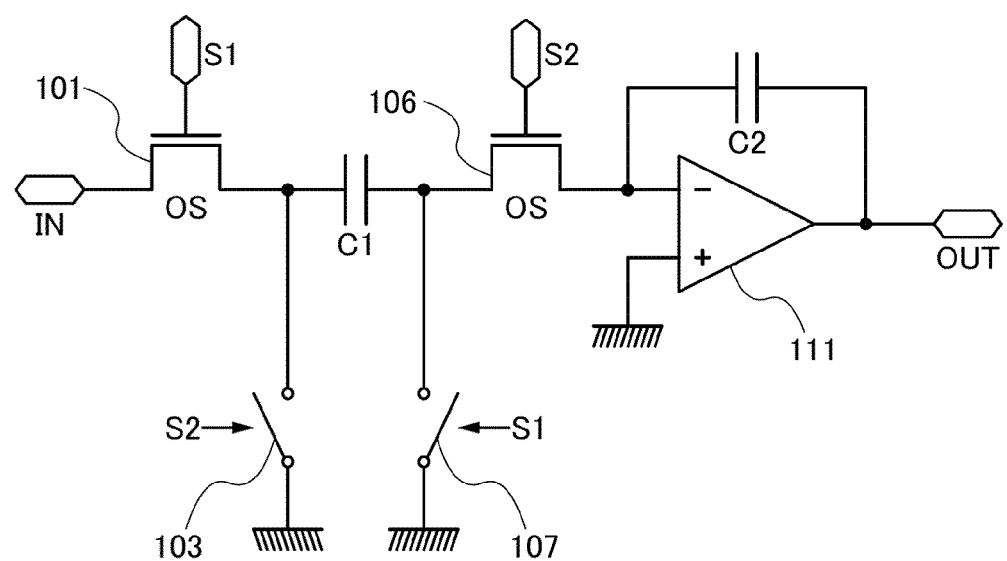
FIG. 4 shows a semiconductor circuit that is one embodiment of the present invention.

FIG. 4 shows a structure of a switched capacitor integrating circuit described as an example.

A structure of the switched capacitor integrating circuit shown in FIG. 4 is a structure in which the transistor 102 is removed from and a transistor 106 and a switch 107 are added to the structure of the switched capacitor amplifier circuit described as an example in FIG. 1.

The transistor 106 is connected in series between the capacitor C1 and the operational amplifier circuit 111. Further, a first electrode of the switch 107 is connected to a node between the capacitor C1 and the transistor 106 and a second electrode of the switch 107 is grounded.

The transistor 101 and the switch 107 are controlled by the clock signal S1. On the other hand, the transistor 106 and the switch 103 are controlled by the clock signal S2 having a phase opposite to that of the clock signal S1. Here, a period during which the transistor 101 and the switch 107 are turned on by the clock signal S1 is a sampling period, and a period during which the transistor 106 and the switch 103 are turned on by the clock signal S2 is a hold period.

In the sampling period, a charge based on the input voltage Vin is accumulated in the capacitor C1. Next, when the sampling period is shifted to the hold period, the charge accumulated in the capacitor C1 moves to the capacitor C2 through the transistor 106; thus, voltages (which correspond to the output voltage Vout) applied to both terminals of the capacitor C2 are changed on the basis of the charge. Then, when the hold period is shifted to the sampling period, the transistor 106 is turned off, so that the charge accumulated in the capacitor C2 is held and a value of the output voltage Vout is kept at a value in the hold period just before the sampling period. In such a manner, the output voltage Vout obtained by integrating the input voltage Vin which is input to the input terminal is output to an output terminal.

Here, the transistor with extremely small off-state current described as an example in the above is used as each of the transistor 101 and the transistor 106.

Thus, in the sampling period, with the transistor 106, the operational amplifier circuit 111 and the capacitor C2 are almost completely insulated from the capacitor C1 to which the input voltage Vin is input, whereby input of noise to the output signal OUT due to the input signal IN is greatly suppressed and a stable output signal can be obtained. Further, in the hold period, the input signal IN and the capacitor C1 are almost completely insulated from each other with the transistor 101, so that input of noise to the output signal OUT due to the input signal is greatly suppressed and a stable output signal can be obtained.

As described above, in a semiconductor circuit including a combination of an operational amplifier and a switched capacitor circuit in which the transistor with extremely small off-state current described as an example in the above and a capacitor are connected to each other in series or parallel, problems caused by the leakage current of a switching element are suppressed and stable input output characteristics can be obtained.

This embodiment can be combined with any of the other embodiments disclosed in this specification as appropriate.

Embodiment 2

In this embodiment, examples of a transistor including an oxide semiconductor layer which can be used for the semiconductor circuit in the above embodiment will be described.

Structural examples of the transistor including the oxide semiconductor layer will be described with reference to FIGS. 5A to 5D. FIGS. 5A to 5D are schematic cross-sectional views each illustrating a structural example of the transistor in this embodiment.

Figure 5A:
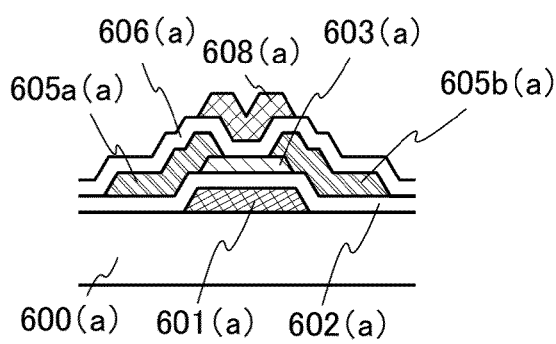
FIGS. 5A to 5D each show a structure of a transistor that is one embodiment of the present invention.

A transistor shown in FIG. 5A includes a conductive layer 601 (a), an insulating layer 602 (a), a semiconductor layer 603 (a), a conductive layer 605a (a), a conductive layer 605b (a), an insulating layer 606 (a), and a conductive layer 608 (a).

The conductive layer 601 (a) is provided over an element formation layer 600 (a).

The insulating layer 602 (a) is provided over the conductive layer 601 (a).

The semiconductor layer 603 (a) overlaps with the conductive layer 601 (a) with the insulating layer 602 (a) provided therebetween.

The conductive layer 605a (a) and the conductive layer 605b (a) are each provided over the semiconductor layer 603 (a) and electrically connected to the semiconductor layer 603 (a).

The insulating layer 606 (a) is provided over the semiconductor layer 603 (a), the conductive layer 605a (a), and the conductive layer 605b (a).

The conductive layer 608 (a) overlaps with the semiconductor layer 603 (a) with the insulating layer 606 (a) provided therebetween.

Note that one of the conductive layer 601 (a) and the conductive layer 608 (a) is not necessarily provided. In the case where the conductive layer 608 (a) is not provided, the insulating layer 606 (a) is not necessarily provided.

Figure 5C:
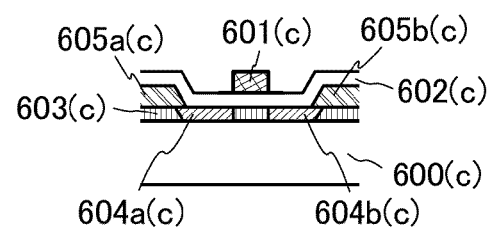
Figure 5B:
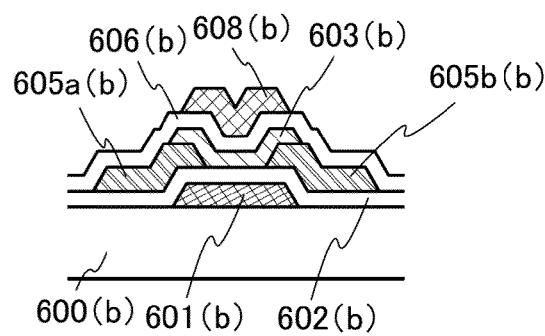

A transistor shown in FIG. 5B includes a conductive layer 601 (b), an insulating layer 602 (b), a semiconductor layer 603 (b), a conductive layer 605a (b), a conductive layer 605b (b), an insulating layer 606 (b), and a conductive layer 608 (b).

The conductive layer 601 (b) is provided over an element formation layer 600 (b).

The insulating layer 602 (b) is provided over the conductive layer 601 (b).

The conductive layer 605a (b) and the conductive layer 605b (b) are each provided over part of the insulating layer 602 (b).

The semiconductor layer 603 (b) is provided over the conductive layer 605a (b) and the conductive layer 605b (b) and electrically connected to the conductive layer 605a (b) and the conductive layer 605b (b). Further, the semiconductor layer 603 (b) overlaps with the conductive layer 601 (b) with the insulating layer 602 (b) provided therebetween.

The insulating layer 606 (b) is provided over the semiconductor layer 603 (b), the conductive layer 605a (b), and the conductive layer 605b (b).

The conductive layer 608 (b) overlaps with the semiconductor layer 603 (b) with the insulating layer 606 (b) provided therebetween.

Note that one of the conductive layer 601 (b) and the conductive layer 608 (b) is not necessarily provided. In the case where the conductive layer 608 (b) is not provided, the insulating layer 606 (b) is not necessarily provided.

A transistor shown in FIG. 5C includes a conductive layer 601 (c), an insulating layer 602 (c), a semiconductor layer 603 (c), a conductive layer 605a (c), and a conductive layer 605b (c).

The semiconductor layer 603 (c) includes a region 604a (c) and a region 604b (c). The region 604a (c) and the region 604b (c) are separated from each other and a dopant is added to each of the regions. A region between the region 604a (c) and the region 604b (c) serves as a channel formation region. The semiconductor layer 603 (c) is provided over an element formation layer 600 (c). Note that the region 604a (c) and the region 604b (c) are not necessarily provided.

The conductive layer 605a (c) and the conductive layer 605b (c) are provided over the semiconductor layer 603 (c) and electrically connected to the semiconductor layer 603 (c). Side surfaces of the conductive layer 605a (c) and the conductive layer 605b (c) are tapered.

The conductive layer 605a (c) overlaps with part of the region 604a (c); however, the present invention is not necessarily limited to this. When the conductive layer 605a (c) partly overlaps with the region 604a (c), resistance between the conductive layer 605a (c) and the region 604a (c) can be low. Further, an entire region in the semiconductor layer 603 (c), which overlaps with the conductive layer 605a (c) may be the region 604a (c).

The conductive layer 605b (c) overlaps with part of the region 604b (c); however, the present invention is not limited to this. When the conductive layer 605b (c) partly overlaps with the region 604b (c), resistance between the conductive layer 605b (c) and the region 604b (c) can be low. Further, an entire region in the semiconductor layer 603 (c), which overlaps with the conductive layer 605b (c) may be the region 604b (c).

The insulating layer 602 (c) is provided over the semiconductor layer 603 (c), the conductive layer 605a (c), and the conductive layer 605b (c).

The conductive layer 601 (c) overlaps with the semiconductor layer 603 (c) with the insulating layer 602 (c) provided therebetween. A region in the semiconductor layer 603 (c), which overlaps with the conductive layer 601 (*c*) with the insulating layer 602 (*c*) provided therebetween serves as the channel formation region.

Figure 5D:
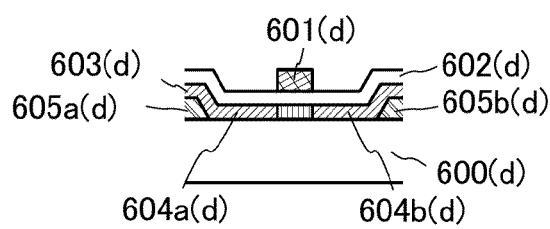

A transistor shown in FIG. 5D includes a conductive layer 601 (*d*), an insulating layer 602 (*d*), a semiconductor layer 603 (*d*), a conductive layer 605*a* (d), and a conductive layer 605*b* (d).

The conductive layer 605*a* (d) and the conductive layer 605*b* (d) are provided over an element formation layer 600 (*d*). Side surfaces of the conductive layer 605*a* (d) and the conductive layer 605*b* (d) are tapered.

The semiconductor layer 603 (*d*) includes a region 604*a* (d) and a region 604*b* (d). The region 604*a* (d) and the region 604*b* (d) are separated from each other and a dopant is added to each of the regions. A region between the region 604*a* (d) and the region 604*b* (d) serves as a channel formation region. The semiconductor layer 603 (*d*) is provided over the conductive layer 605*a* (d), the conductive layer 605*b* (d), and the element formation layer 600 (*d*) and electrically connected to the conductive layer 605*a* (d) and the conductive layer 605*b* (d). Note that the region 604*a* (d) and the region 604*b* (d) are not necessarily provided.

The region 604*a* (d) is electrically connected to the conductive layer 605*a* (d).

The region 604*b* (d) is electrically connected to the conductive layer 605*b* (d).

The insulating layer 602 (*d*) is provided over the semiconductor layer 603 (*d*).

The conductive layer 601 (*d*) overlaps with the semiconductor layer 603 (*d*) with the insulating layer 602 (*d*) provided therebetween. A region in the semiconductor layer 603 (*d*), which overlaps with the conductive layer 601 (*d*) with the insulating layer 602 (*d*) provided therebetween serves as the channel formation region.

The components shown in FIGS. 5A to 5D will be described below.

As the element formation layers 600 (*a*) to 600 (*d*), insulating layers, substrates having insulating surfaces, or the like can be used, for example. Further, layers over which elements are formed in advance can be used as the element formation layers 600 (*a*) to 600 (*d*).

Each of the conductive layers 601 (*a*) to 601 (*d*) has a function of a gate of the transistor. Note that a layer having a function of a gate of the transistor can be called a gate electrode or a gate wiring.

As the conductive layers 601 (*a*) to 601 (*d*), a layer of a metal material such as molybdenum, magnesium, titanium, chromium, tantalum, tungsten, aluminum, copper, neodymium, or scandium or an alloy material containing any of these materials as a main component can be used, for example. Alternatively, the conductive layers 601 (*a*) to 601 (*d*) can be formed by stacking layers of any of materials that can be used for the conductive layers 601 (*a*) to 601 (*d*).

Each of the insulating layers 602 (*a*) to 602 (*d*) has a function of a gate insulating layer of the transistor.

Each of the insulating layers 602 (*a*) to 602 (*d*) can be, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, or a lanthanum oxide layer. Each of the insulating layers 602 (*a*) to 602 (*d*) can be a stack of layers of any of materials that can be used for the insulating layers 602 (*a*) to 602 (*d*).

Alternatively, the insulating layers 602 (*a*) to 602 (*d*), an insulating layer of a material containing, for example, an element that belongs to Group 13 in the periodic table and oxygen can be used. When the semiconductor layers 603 (*a*) to 603 (*d*) contain an element that belongs to Group 13, the use of insulating layers each containing an element that belongs to Group 13 as insulating layers in contact with the semiconductor layers 603 (*a*) to 603 (*d*) makes the state of interfaces between the insulating layers and the oxide semiconductor layers favorable.

Examples of the material containing an element that belongs to Group 13 include gallium oxide, aluminum oxide, aluminum gallium oxide, and gallium aluminum oxide. Note that aluminum gallium oxide refers to a substance in which the amount of aluminum is larger than that of gallium in atomic percent, and gallium aluminum oxide refers to a substance in which the amount of gallium is larger than or equal to that of aluminum in atomic percent. As the insulating layers 602 (*a*) to 602 (*d*), a material represented by $Al_2O_x$ ($x=3+\alpha$, where $\alpha$ is larger than 0 and smaller than 1), $Ga_2O_x$ ($x=3+\alpha$, where $\alpha$ is larger than 0 and smaller than 1), or $Ga_xAl_{2-x}O_{3+\alpha}$ (x is larger than 0 and smaller than 2 and $\alpha$ is larger than 0 and smaller than 1) can be used, for example.

Each of the insulating layers 602 (*a*) to 602 (*d*) can be a stack of layers of any of materials which can be used for the insulating layers 602 (*a*) to 602 (*d*). For example, the insulating layers 602 (*a*) to 602 (*d*) can be a stack of layers containing gallium oxide represented by $Ga_2O_x$. Alternatively, the insulating layers 602 (*a*) to 602 (*d*) may be a stack of layers of an insulating layer containing gallium oxide represented by $Ga_2O_x$ and an insulating layer containing aluminum oxide represented by $Al_2O_x$.

Each of the semiconductor layers 603 (*a*) to 603 (*d*) functions as a layer in which a channel of the transistor is formed. As an oxide semiconductor that can be used for the semiconductor layers 603 (*a*) to 603 (*d*), a metal oxide such as a four-component metal oxide, a three-component metal oxide, and a two-component metal oxide can be used, for example.

As the four-component metal oxide, an In—Sn—Ga—Zn—O-based metal oxide or the like can be used, for example.

As the three-component metal oxide, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, or the like can be used, for example.

As the oxide of two-component oxide, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Sn—O-based metal oxide, or an In—Ga—O-based metal oxide can be used, for example.

Further, an In—O-based metal oxide, a Sn—O-based metal oxide, a Zn—O-based metal oxide, or the like can also be used as the oxide semiconductor. The metal oxide that can be used as the oxide semiconductor may contain silicon oxide.

In the case of using an In—Zn—O-based metal oxide, for example, an oxide target which has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio) can be used for forming a semiconductor layer of an In—Zn—O-based oxide. For example, when the atomic ratio of the target used for the formation of the In—Zn—O-based oxide semiconductor is expressed by In:Zn:O=S:U:R, R>1.5S+U. An increase in the amount of indium enables mobility of the transistor to increase.

As the oxide semiconductor, a material represented by InLO$_3$ (ZnO)$_m$ (m is larger than 0) can be used. Here, L in InLO$_3$(ZnO)$_m$ represents one or more metal elements selected from Ga, Al, Mn, or Co.

The oxide semiconductor is in a single crystal state, a polycrystalline (also referred to as polycrystal) state, an amorphous state, or the like.

At least a region of each of the semiconductor layers 603 (*a*) to 603 (*d*), in which the channel is formed may be crystalline and a non-single-crystal and include a phase which has a triangular, hexagonal, regular triangular, or regular hexagonal atomic arrangement when seen from the direction perpendicular to the a-b plane and in which metal atoms are arranged in a layered manner in the direction perpendicular to the c-axis direction or the metal atoms and oxygen atoms are arranged in a layered manner in the direction perpendicular to the c-axis direction. An oxide semiconductor including the above-described phase is also referred to as a c-axis aligned crystalline oxide semiconductor (CAAC-OS).

Further, when the channel length of the transistor is 30 nm, the thickness of each of the semiconductor layers 603 (*a*) to 603 (*d*) may be approximately 5 nm, for example. In this case, if the semiconductor layers 603 (*a*) to 603 (*d*) are CAAC oxide semiconductor layers, a short channel effect in the transistor can be suppressed.

The CAAC-OS will be described in detail in Embodiment 4.

A dopant imparting n-type or p-type conductivity is added to each of the region 604*a* (c), the region 604*b* (c), the region 604*a* (d), and the region 604*b* (d), and the region 604*a* (c), the region 604*b* (c), the region 604*a* (d), and the region 604*b* (d) each function as a source or a drain of the transistor. As the dopant, one or more of elements of Group 13 in the periodic table (e.g., boron) and elements of Group 15 in the periodic table (e.g., nitrogen, phosphorus, and arsenic) can be used. Note that a region functioning as the source of the transistor is also referred to as a source region, and a region functioning as the drain of the transistor is also referred to as a drain region. When the dopant is added to the region 604*a* (c), the region 604*b* (c), the region 604*a* (d), and the region 604*b* (d), the connection resistance between the regions and the conductive layers can be reduced, so that the transistor can be miniaturized.

The conductive layers 605*a* (a) to 605*a* (d) and the conductive layers 605*b* (a) to 605*b* (d) function as the source or the drain of the transistor. Note that a layer functioning as a source of the transistor is also referred to as a source electrode or a source wiring, and a layer functioning as a drain of the transistor is also referred to as a drain electrode or a drain wiring.

Each of the conductive layers 605*a* (a) to 605*a* (d) and the conductive layers 605*b* (a) to 605*b* (d) can be formed using, for example, a layer of a metal material such as aluminum, magnesium, chromium, copper, tantalum, titanium, molybdenum, or tungsten; or an alloy material which contains any of the above metal materials as a main component. For example, each of the conductive layers 605*a* (a) to 605*a* (d) and the conductive layers 605*b* (a) to 605*b* (d) can be formed using a stacked-layer structure including a layer of an alloy material containing copper, magnesium, and aluminum. Alternatively, each of the conductive layers 605*a* (a) to 605*a* (d) and the conductive layers 605*b* (a) to 605*b* (d) can be formed using a stacked-layer structure of any of materials that can be used for the conductive layers 605*a* (a) to 605*a* (d) and the conductive layers 605*b* (a) to 605*b* (d). For example, each of the conductive layers 605*a* (a) to 605*a* (d) and the conductive layers 605*b* (a) to 605*b* (d) can be formed using a stacked-layer structure including a layer of an alloy material containing copper, magnesium, and aluminum and a layer containing copper.

Further, a layer containing a conductive metal oxide can be used for each of the conductive layers 605*a* (a) to 605*a* (d) and the conductive layers 605*b* (a) to 605*b* (d). Examples of the conductive metal oxide include indium oxide, tin oxide, zinc oxide, indium oxide-tin oxide, and indium oxide-zinc oxide. Note that the conductive metal oxide that can be used for each of the conductive layers 605*a* (a) to 605*a* (d) and the conductive layers 605*b* (a) to 605*b* (d) may contain silicon oxide.

For each of the insulating layers 606 (*a*) and 606 (*b*), a layer of a material that can be used for the insulating layers 602 (*a*) to 602 (*d*) can be used. Alternatively, each of the insulating layers 606 (*a*) and 606 (*b*) can be formed using a stacked-layer structure of any of materials that can be used for the insulating layers 606 (*a*) and 606 (*b*). For example, each of the insulating layers 606 (*a*) and 606 (*b*) may be formed using a silicon oxide layer, an aluminum oxide layer, or the like. For example, with the use of an aluminum oxide layer, effect of preventing impurities from entering the semiconductor layers 603 (*a*) and 603 (*b*) can be further improved, and effect of preventing elimination of oxygen in the semiconductor layers 603 (*a*) and 603 (*b*) can also be improved.

Each of the conductive layers 608 (*a*) and 608 (*b*) functions as a gate of the transistor. Note that in the case where the transistor includes both the conductive layers 601 (*a*) and 608 (*a*) or both the conductive layers 601 (*b*) and 608 (*b*), one of the conductive layers 601 (*a*) and 608 (*a*) or one of the conductive layers 601 (*b*) and 608 (*b*) is referred to as a back gate, a back gate electrode, or a back gate wiring. A plurality of conductive layers each functioning as a gate are provided with the channel formation layer provided therebetween, whereby the threshold voltage of the transistor can be easily controlled.

As each of the conductive layers 608 (*a*) and 608 (*b*), a layer of a material that can be used for the conductive layers 601 (*a*) to 601 (*d*) can be used, for example. Each of the conductive layers 608 (*a*) and 608 (*b*) may be formed using a stacked-layer structure of any of materials that can be used for the conductive layers 608 (*a*) and 608 (*b*).

Note that the transistor of this embodiment may have a structure in which an insulating layer is provided over part of the oxide semiconductor layer functioning as a channel formation layer and a conductive layer functioning as a source or a drain is provided to overlap with the oxide semiconductor layer with the insulating layer interposed therebetween. In the case of the above structure, the insulating layer functions as a layer protecting the channel formation layer (also referred to as a channel protective layer) of the transistor. As the insulating layer functioning as a channel protective layer, a layer including a material that can be used for the insulating layers 602 (*a*) to 602 (*d*) can be used for example. Alternatively, an insulating layer functioning as a channel protective layer may be formed by stacking layers of any of materials that can be used for the insulating layers 602 (*a*) to 602 (*d*).

Further, a base layer may be formed over each of the element formation layers 600 (*a*) to 600 (*d*) and the transistor may be formed over the base layer. In this case, a layer of a material that can be used for the insulating layers 602 (*a*) to 602 (*d*) can be used as the base layer, for example. Alternatively, the base layer may be formed using a stacked-layer structure of any of materials that can be used for the insulating layers 602 (*a*) to 602 (*d*). For example, when the base layer is formed using a stacked-layer structure of an aluminum oxide layer and a silicon oxide layer, elimination of oxygen included in the base layer through the semiconductor layers 603 (a) to 603 (d) can be suppressed.

Next, as an example of a method for manufacturing the transistor in this embodiment, an example of a method for manufacturing the transistor shown in FIG. 5A will be described below with reference to FIGS. 6A to 6E. FIGS. 6A to 6E are schematic cross-sectional views showing an example of the method for manufacturing the transistor in FIG. 5A.

Figure 6A:
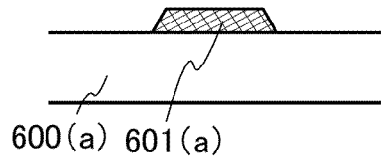
FIGS. 6A to 6E show a method for manufacturing a transistor that is one embodiment of the present invention.

First, as shown in FIG. 6A, the element formation layer 600 (a) is prepared, a first conductive film is formed over the element formation layer 600 (a), and part of the first conductive film is etched to form the conductive layer 601 (a).

A film of a material that can be used for the conductive layer 601 (a) is formed by a sputtering method, so that the first conductive film can be formed, for example. The first conductive film can be formed by stacking layers each formed of a material that can be used for the first conductive film.

When a high-purity gas from which impurities such as hydrogen, water, a hydroxyl group, and a hydride are removed is used as a sputtering gas, the concentration of the impurities in a film to be formed can be reduced.

Note that before the film is formed by a sputtering method, preheat treatment may be performed in a preheating chamber of a sputtering apparatus. With the preheat treatment, impurities such as hydrogen and moisture can be eliminated.

Further, before the film is formed by a sputtering method, it is possible to perform the following treatment (called reverse sputtering): instead of applying a voltage to the target side, an RF power source is used for applying a voltage to the substrate side in an argon, nitrogen, helium, or oxygen atmosphere so that plasma is generated to modify a surface where the film is to be formed. With reverse sputtering, powdery substances (also referred to as particles or dust) attached to the surface where the film is to be formed can be removed.

In the case where the film is formed by a sputtering method, moisture remaining in a deposition chamber used for forming the film can be removed with an entrapment vacuum pump or the like. As the entrapment vacuum pump, a cryopump, an ion pump, or a titanium sublimation pump can be used, for example. Moisture remaining in the deposition chamber can be removed with a turbomolecular pump provided with a cold trap. With the use of the vacuum pump, backflow of exhausted air including impurities can be reduced.

As a method for forming the conductive layer 601 (a), the example of a method for manufacturing the transistor of this embodiment employs, for example, the following steps in order to form a layer by etching part of a film: a resist mask is formed over part of the film by a photolithography process and the film is etched using the resist mask, thereby forming the layer. Note that in this case, the resist mask is removed after the layer is formed.

Note that the resist mask may be formed by an inkjet method. A photomask is not used in an inkjet method; thus, manufacturing cost can be reduced. Alternatively, the resist mask may be formed using a light-exposure mask having a plurality of regions with different transmittances (also referred to as a multi-tone mask). With the use of the multi-tone mask, a resist mask having different thicknesses can be formed, and the number of resist masks used for manufacturing the transistor can be reduced.

Figure 6B:
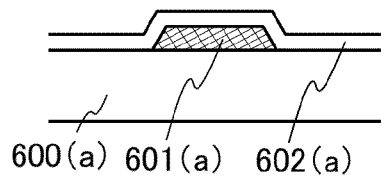

Next, as shown in FIG. 6B, a first insulating film is formed over the conductive layer 601 (a), so that the insulating layer 602 (a) is formed.

For example, a film of a material that can be used for the insulating layer 602 (a) is formed by a sputtering method, a plasma CVD method, or the like, so that the first insulating film can be formed. Alternatively, the first insulating film can be formed by a stack of layers of materials that can be used for the insulating layer 602 (a). Further, when the film formed using a material that can be used for the insulating layer 602 (a) is formed by a high-density plasma-enhanced CVD method (e.g., a high-density plasma-enhanced CVD method using microwaves (e.g., microwaves with a frequency of 2.45 GHz)), the insulating layer 602 (a) can be dense and can have higher breakdown voltage.

Figure 6C:
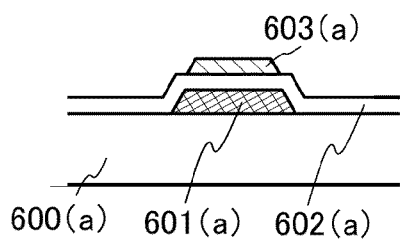

Next, an oxide semiconductor film is formed over the insulating layer 602 (a) and then part of the oxide semiconductor film is etched, whereby the oxide semiconductor layer 603 (a) is formed as shown in FIG. 6C.

For example, a film of an oxide semiconductor material that can be used for the semiconductor layer 603 (a) is formed by a sputtering method, whereby the oxide semiconductor film can be formed. Note that the oxide semiconductor film may be formed in a rare gas atmosphere, an oxygen atmosphere, or a mixed atmosphere of a rare gas and oxygen. Further, in the case where a CAAC oxide semiconductor layer is formed as the semiconductor layer 603 (a), an oxide semiconductor film is formed by a sputtering method while the temperature of the element formation layer over which the oxide semiconductor film is formed is set at higher than or equal to 100° C. and lower than or equal to 500° C., preferably higher than or equal to 200° C. and lower than or equal to 350° C. In this case, it is preferable that the concentration of impurities such as hydrogen or water in a sputtering apparatus be extremely low. For example, when heat treatment is performed before the formation of the oxide semiconductor film, the concentration of impurities such as hydrogen or water in the sputtering apparatus can be reduced. Further, in this case, the insulating layer 602 (a) is preferably flat. For example, the average surface roughness of the insulating layer 602 (a) is preferably less than 0.5 nm, more preferably less than or equal to 0.1 nm.

The oxide semiconductor film can be formed using an oxide target having a composition ratio: $In_2O_3:Ga_2O_3:ZnO=1:1:1$ in molar ratio as a sputtering target. Alternatively, the oxide semiconductor film may be formed using an oxide target having a composition ratio: $In_2O_3:Ga_2O_3:ZnO=1:1:2$ in molar ratio, for example.

The composition ratio of a target of an oxide semiconductor used for forming a film of an In—Sn—Zn—O-based material can be In:Sn:Zn=1:2:2, 2:1:3, 1:1:1, or 20:45:35 in an atomic ratio.

Further, in the case of using a sputtering method, the semiconductor layer 603 (a) is formed in a rare gas (typically argon) atmosphere, an oxygen atmosphere, or a mixed atmosphere of a rare gas and oxygen, for example. In the case where the semiconductor layer 603 (a) is formed in a mixed atmosphere of a rare gas and oxygen, the amount of oxygen is preferably greater than the amount of a rare gas.

Figure 6D:
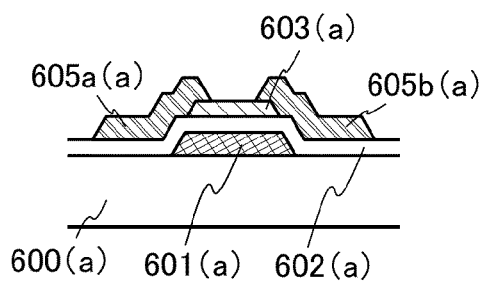

Next, as shown in FIG. 6D, a second conductive film is formed over the insulating layer 602 (a) and the semiconductor layer 603 (a) and is partly etched, so that the conductive layer 605a (a) and the conductive layer 605b (b) are formed.

For example, a material that can be used for the conductive layer 605a (a) and the conductive layer 605b (a) is formed by sputtering or the like, whereby the second conductive film can be formed. Alternatively, the second conductive film can be formed by stacking films formed using materials that can be used for the conductive layer 605a (a) and the conductive layer 605b (a).

Figure 6E:
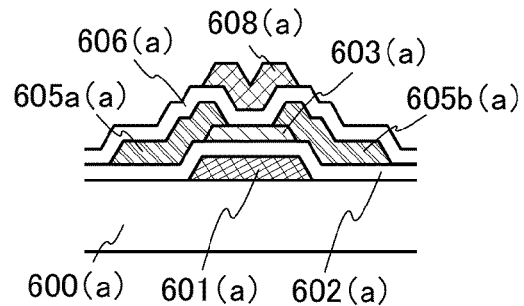

Next, as shown in FIG. 6E, the insulating layer 606 (a) is formed to be in contact with the semiconductor layer 603 (a).

For example, a film that can be used as the insulating layer 606 (a) is formed in a rare gas (typically, argon) atmosphere, an oxygen atmosphere, or a mixed atmosphere of a rare gas and oxygen by a sputtering method, whereby the insulating film 606 (a) can be formed. Forming the insulating layer 606 (a) by a sputtering method can suppress the decrease in the resistance value of part of the semiconductor layer 603 (a) that functions as a back channel of the transistor. The temperature of the substrate at the time when the insulating layer 606 (a) is formed is preferably higher than or equal to room temperature and lower than or equal to 300° C.

Before formation of the insulating layer 606 (a), plasma treatment with the use of a gas of $N_2O$, $N_2$, Ar, or the like may be performed to remove water or the like adsorbed on an exposed surface of the semiconductor layer 603 (a). In the case of performing the plasma treatment, the insulating layer 606 (a) is preferably formed after the plasma treatment without exposure to air.

Further, in the example of the method for manufacturing the transistor in FIG. 5A, heat treatment is performed, for example, at higher than or equal to 600° C. and lower than or equal to 750° C., or higher than or equal to 600° C. and lower than the strain point of the substrate. For example, the heat treatment is performed after the oxide semiconductor film is formed, after part of the oxide semiconductor film is etched, after the second conductive film is formed, after part of the second conductive film is etched, or after the insulating layer 606 (a) is formed.

Note that a heat treatment apparatus for the heat treatment can be an electric furnace or an apparatus for heating an object by heat conduction or heat radiation from a heater such as a resistance heater. For example, a rapid thermal anneal (RTA) apparatus such as a gas rapid thermal anneal (GRTA) apparatus, or a lamp rapid thermal anneal (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, a rare gas or an inert gas (e.g., nitrogen) which does not react with the object by the heat treatment can be used.

After the heat treatment, a high-purity oxygen gas, a high-purity $N_2O$ gas, or ultra-dry air (with a dew point of −40° C. or lower, preferably −60° C. or lower) may be introduced into the furnace that has been used in the above heat treatment. It is preferable that the oxygen gas or the $N_2O$ gas do not contain water, hydrogen, and the like. The purity of the oxygen gas or the $N_2O$ gas which is introduced into the heat treatment apparatus is preferably greater than or equal to 6N, more preferably greater than or equal to 7N (i.e., the impurity concentration of the oxygen gas or the $N_2O$ gas is preferably less than or equal to 1 ppm, more preferably less than or equal to 0.1 ppm). By the action of the oxygen gas or the $N_2O$ gas, oxygen is supplied to the semiconductor layer 603 (a), so that defects caused by oxygen deficiency in the semiconductor layer 603 (a) can be reduced. Note that the high-purity oxygen gas, the high-purity $N_2O$ gas, or the ultra-dry air may be introduced at the time of the heat treatment.

Oxygen doping using oxygen plasma may be performed after the insulating layer 602 (a) is formed, after the oxide semiconductor film is formed, after the conductive layers serving as the source electrode and the drain electrode are formed, after the insulating layer over the conductive layers serving as the source electrode and the drain electrode is formed, or after the heat treatment is performed. For example, an oxygen doping treatment using a high-density plasma of 2.45 GHz may be performed. Alternatively, oxygen doping treatment may be performed by an ion implantation method or ion doping. The oxygen doping can reduce variations in electrical characteristics of transistors which are manufactured. For example, by performing oxygen doping, one of or both the insulating layer 602 (a) and the insulating layer 606 (a) have oxygen having higher proportion than that in the stoichiometric composition.

When the insulating layer which is in contact with the semiconductor layer 603 (a) contains oxygen excessively, the semiconductor layer 603 (a) is easily supplied with oxygen. As a result, an oxygen defect in the semiconductor layer 603 (a) or at an interface between the semiconductor layer 603 (a) and one of or both the insulating layer 602 (a) and the insulating layer 606 (a) can be reduced, which results in further reduction in the carrier concentration in the semiconductor layer 603 (a). Without limitation thereon, in the case where the semiconductor layer 603 (a) contains oxygen excessively by the manufacturing steps, elimination of oxygen from the semiconductor layer 603 (a) can be prevented by the insulating layer in contact with the semiconductor layer 603 (a).

For example, when an insulating layer containing gallium oxide is formed as one or each of the insulating layer 602 (a) and the insulating layer 606 (a), the composition of the gallium oxide can be set to be $Ga_2O_x$ by supplying the insulating layer with oxygen.

Alternatively, when an insulating layer containing aluminum oxide is formed as one or each of the insulating layer 602 (a) and the insulating layer 606 (a), the composition of the aluminum oxide can be set to be $Al_2O_x$ by supplying the insulating layer with oxygen.

Further, when an insulating layer containing gallium aluminum oxide or aluminum gallium oxide is formed as one or each of the insulating layer 602 (a) and the insulating layer 606 (a), the composition of the gallium aluminum oxide or the aluminum gallium oxide can be set to be $Ga_xAl_{2-x}O_{3+\alpha}$ by supplying the insulating layer with oxygen.

Through the above steps, impurities such as hydrogen, water, a hydroxyl group, and hydride (also referred to as a hydrogen compound) are removed from the semiconductor layer 603 (a) and oxygen is supplied to the semiconductor layer 603 (a); thus, the oxide semiconductor layer can be highly purified.

Further, in addition to the heat treatment, after the insulating layer 606 (a) is formed, heat treatment (preferably at higher than or equal to 200° C. and lower than or equal to 600° C., for example, higher than or equal to 250° C. and lower than or equal to 350° C.) may be performed in an inert gas atmosphere or an oxygen gas atmosphere.

In addition, as shown in FIG. 6E, a third conductive film is formed over the insulating layer 606 (a) and part of the third conductive film is etched, whereby the conductive layer 608 (a) is formed.

For example, a film formed using a material that can be used for the conductive layer 608 (a) is formed by a sputtering method, whereby the third conductive film can be formed. The third conductive film can be formed by stacking layers formed of materials that can be used for the third conductive film.

Note that although the example of the method for manufacturing the transistor shown in FIG. 5A is described, this embodiment is not limited to this. For example, as for the components in FIGS. 5B to 5D that have the same designations as the components in FIG. 5A and whose functions are at least partly the same as those of the components in FIG. 5A, the description of the example of the method for manufacturing the transistor shown in FIG. 5A can be referred to as appropriate.

In the case where the regions 604a (c) and 604a (d) or the regions 604b (c) and 604b (d) are formed as shown in FIG. 5C or FIG. 5D, the regions 604a (c) and 604a (d) or the regions 604b (c) and 604b (d) are formed in a self-aligned manner by adding a dopant to a semiconductor layer from a side where a conductive layer serving as a gate is formed with an insulating layer serving as a gate insulating layer provided therebetween.

For example, the dopant can be added with the use of an ion doping apparatus or an ion implantation apparatus.

As described with FIGS. 5A to 5D and FIGS. 6A to 6E, examples of the transistor in this embodiment each include the conductive layer serving as the gate; the insulating layer serving as the gate insulating layer; the oxide semiconductor layer which overlaps with the conductive layer serving as the gate with the insulating layer serving as the gate insulating layer provided therebetween and in which a channel is formed; the conductive layer which is electrically connected to the oxide semiconductor layer and serves as one of the source and the drain; and the conductive layer which is electrically connected to the oxide semiconductor layer and serves as the other of the source and the drain.

The oxide semiconductor layer in which a channel is formed is an oxide semiconductor layer which is made an i-type or substantially i-type by being purified. With the highly purified oxide semiconductor layer, the carrier concentration of the oxide semiconductor layer can be lower than $1 \times 10^{14}/cm^3$, preferably lower than $1 \times 10^{12}/cm^3$, further preferably lower than $1 \times 10^{11}/cm^3$. With the above structure, the off-state current per micrometer of the channel width can be lower than or equal to 10 aA ($1 \times 10^{-17}$ A), lower than or equal to 1 aA ($1 \times 10^{-18}$ A), lower than or equal to 10 zA ($1 \times 10^{-20}$ A), further lower than or equal to 1 zA ($1 \times 10^{-21}$ A), and furthermore lower than or equal to 100 yA ($1 \times 10^{-22}$ A). It is preferable that the off-state current of the transistor be as low as possible. The lowest value of the off-state current of the transistor in this embodiment is estimated to be about $10^{-30}$ A/μm.

When a transistor including the oxide semiconductor layer of this embodiment is used as a switch in the semiconductor circuit in the above embodiment, the leakage current of the switch can be extremely small and the semiconductor circuit can have stable input output characteristics.

This embodiment can be combined with any of the other embodiments disclosed in this specification as appropriate.

Embodiment 3

In this embodiment, structural examples of any of the semiconductor device in the above embodiment will be described.

The semiconductor circuit in this embodiment is formed using a transistor including a semiconductor layer in which a channel is formed and which contains a semiconductor belonging to Group 14 of the periodic table (e.g., silicon) and a transistor including an oxide semiconductor layer in which a channel is formed. In this case, the transistor including an oxide semiconductor layer in which a channel is formed can be stacked over the transistor including a semiconductor layer which contains a semiconductor belonging to Group 14 of the periodic table (e.g., silicon). The transistor including a semiconductor layer which contains a semiconductor belonging to Group 14 of the periodic table (e.g., silicon) can be used as the switch 103 and the transistor included in the operational amplifier circuit 111 in FIG. 1, for example.

Figure 7:
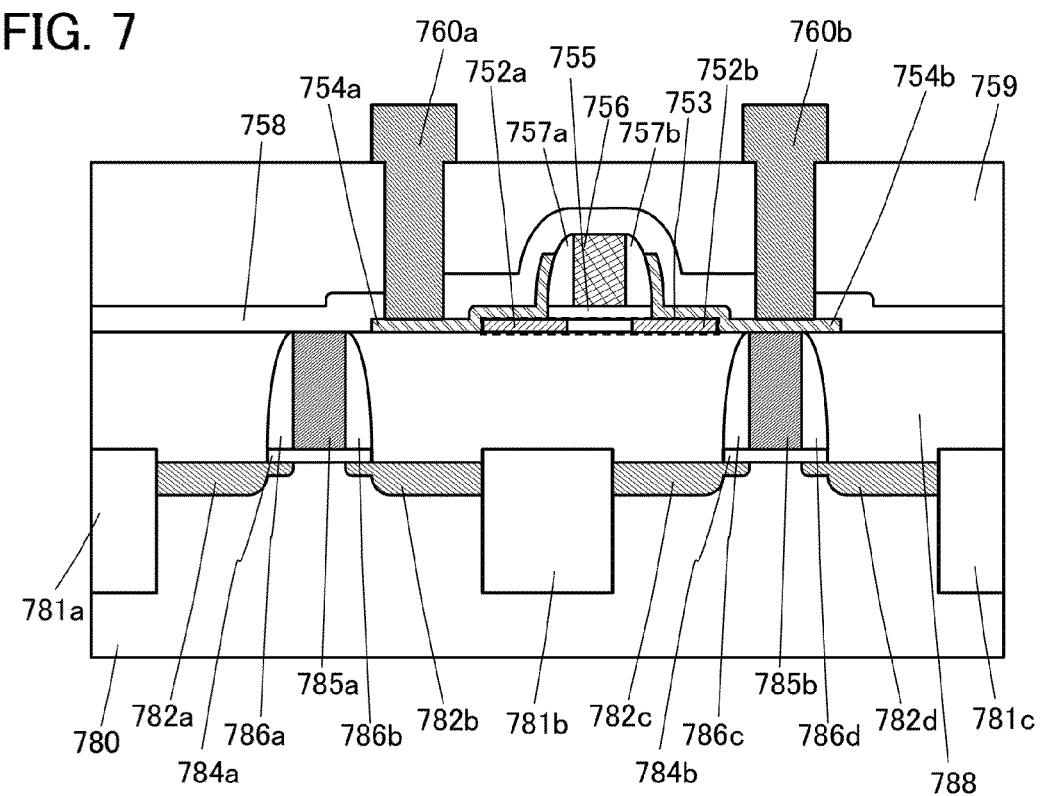
FIG. 7 shows a structure of a semiconductor circuit that is one embodiment of the present invention.

FIG. 7 shows an example in which the transistor including an oxide semiconductor layer in which a channel is formed is stacked over the transistor including a semiconductor layer which contains a semiconductor belonging to Group 14 of the periodic table (e.g., silicon). Note that the components shown in FIG. 7 include those having sizes different from the actual sizes.

In FIG. 7, a p-channel transistor and an n-channel transistor (e.g., the transistor included in the operational amplifier circuit 111 in FIG. 1) each including a semiconductor layer which contains a semiconductor belonging to Group 14 of the periodic table (e.g., silicon) and a transistor (e.g., the transistor 102 in FIG. 1) including an oxide semiconductor layer in which a channel is formed are formed using a semiconductor layer 780, an insulating layer 784a, an insulating layer 784b, a conductive layer 785a, a conductive layer 785b, an insulating layer 786a, an insulating layer 786b, an insulating layer 786c, an insulating layer 786d, an insulating layer 788, a semiconductor layer 753, a conductive layer 754a, a conductive layer 754b, an insulating layer 755, a conductive layer 756, an insulating layer 757a, an insulating layer 757b, an insulating layer 758, an insulating layer 759, a conductive layer 760a, and a conductive layer 760b.

Further, the semiconductor layer 780 includes a region 782a, a region 782b, a region 782c, and a region 782d. The semiconductor layer 780 is provided with insulating regions 781a to 781c, whereby the transistors are electrically separated from each other.

As the semiconductor layer 780, for example, a semiconductor substrate can be used. Alternatively, a semiconductor layer provided over a different substrate can be used as the semiconductor layer 780.

The region 782a and the region 782b are regions which are separated from each other and to which a dopant imparting p-type conductivity is added. The region 782a and the region 782b function as a source region and a drain region of the p-channel transistor. For example, the region 782a and the region 782b may each be electrically connected to an additionally provided conductive layer.

The region 782c and the region 782d are regions which are separated from each other and to which a dopant imparting n-type conductivity is added. The region 782c and the region 782d function as a source region and a drain region of the n-channel transistor. For example, the region 782c and the region 782d may each be electrically connected to an additionally provided conductive layer.

Note that a low-concentration region may be partly provided in each of the regions 782a to 782d. In that case, the depth of the low-concentration regions may be smaller than the depth of the rest of the regions 782a to 782d, but this embodiment is not limited thereto.

The insulating layer 784a is provided over a region of the semiconductor layer 780 which is between the insulating region 781a and the insulating region 781b. The insulating layer 784a functions as a gate insulating layer of the p-channel transistor.

The insulating layer 784b is provided over a region of the semiconductor layer 780 which is between the insulating region 781b and the insulating region 781c. The insulating layer 784b functions as a gate insulating layer of the n-channel transistor.

Each of the insulating layers 784a and 784b can be, for example, a layer of a material such as silicon oxide, silicon nitride, silicon oxynitride, silicon nitride oxide, aluminum oxide, aluminum nitride, aluminum oxynitride, aluminum nitride oxide, hafnium oxide, or an organic insulating material (e.g., polyimide or acrylic). The insulating layers 784a and 784b may be formed by stacking layers of any of materials that can be used for the insulating layers 784a and 784b.

The conductive layer 785a overlaps with the semiconductor layer 780 with the insulating layer 784a provided therebetween. A region of the semiconductor layer 780 which overlaps with the conductive layer 785a is a channel formation region of the p-channel transistor. The conductive layer 785a functions as a gate of the p-channel transistor.

The conductive layer 785b overlaps with the semiconductor layer 780 with the insulating layer 784b provided therebetween. A region of the semiconductor layer 780 which overlaps with the conductive layer 785b is a channel formation region of the n-channel transistor. The conductive layer 785b functions as a gate of the n-channel transistor.

Each of the conductive layers 785a and 785b can be, for example, a layer of a metal material such as molybdenum, magnesium, titanium, chromium, tantalum, tungsten, aluminum, copper, neodymium, or scandium or an alloy material containing any of these materials as a main component. The conductive layers 785a and 785b can also be formed by stacking layers of any of materials that can be used for the conductive layers 785a and 785b.

The insulating layer 786a is provided over the insulating layer 784a and is in contact with one of a pair of side surfaces of the conductive layer 785a which face each other.

The insulating layer 786b is provided over the insulating layer 784a and is in contact with the other of the pair of side surfaces of the conductive layer 785a which face each other.

The insulating layer 786c is provided over the insulating layer 784b and is in contact with one of a pair of side surfaces of the conductive layer 785b which face each other.

The insulating layer 786d is provided over the insulating layer 784b and is in contact with the other of the pair of side surfaces of the conductive layer 785b which face each other.

The insulating layer 788 is provided to cover the conductive layer 785a, the conductive layer 785b, the insulating layer 786a, the insulating layer 786b, the insulating layer 786c, and the insulating layer 786d.

Each of the insulating layers 786a to 786d and the insulating layer 788 can be a layer of any of the materials that can be used for the insulating layers 784a and 784b, which may be the same as or different from the material used for the insulating layers 784a and 784b. Further, the insulating layers 786a to 786d and the insulating layer 788 can each be formed by stacking layers of any of materials that can be used for the insulating layers 786a to 786d and the insulating layer 788.

The semiconductor layer 753 is provided over the insulating layer 788. The semiconductor layer 753 includes a region 752a and a region 752b. The region 752a and the region 752b are regions to which a dopant is added, and function as a source region and a drain region. As the dopant, any of the dopants that can be used for the transistor including an oxide semiconductor layer in the above embodiment can be used as appropriate. Note that the region 752a and the region 752b are not necessarily provided.

The semiconductor layer 753 can be a layer of a material that can be used for the semiconductor layer 603 (a) shown in FIG. 5A, for example.

The insulating layer 755 is provided over the semiconductor layer 753. The insulating layer 755 functions as a gate insulating layer of the transistor.

The insulating layer 755 can be a layer of a material that can be used for the insulating layer 602 (a) shown in FIG. 5A, for example. The insulating layer 755 may be formed by stacking layers of any of materials that can be used for the insulating layer 755.

The conductive layer 756 overlaps with the semiconductor layer 753 with the insulating layer 755 provided therebetween. The conductive layer 756 functions as a gate of the transistor.

The conductive layer 756 can be a layer of a material that can be used for the conductive layer 601 (a) shown in FIG. 5A, for example. The conductive layer 756 may be formed by stacking layers of any of materials that can be used for the conductive layer 756.

The insulating layer 757a and the insulating layer 757b are provided over the insulating layer 755 and in contact with side surfaces of the conductive layer 756. Note that the insulating layer 757a and the insulating layer 757b are not necessarily provided.

The conductive layer 754a is in contact with and electrically connected to the semiconductor layer 753. The conductive layer 754a functions as a source or a drain of the transistor including an oxide semiconductor layer.

The conductive layer 754b is in contact with and electrically connected to the semiconductor layer 753. The conductive layer 754b is electrically connected to the conductive layer 785b. The conductive layer 754b functions as the source or the drain of the transistor including an oxide semiconductor layer.

Each of the conductive layers 754a and 754b can be, for example, a layer of a material that can be used for the conductive layers 605a (a) and 605b (a) shown in FIG. 5A. The conductive layers 754a and 754b may be formed by stacking layers of any of materials that can be used for the conductive layers 754a and 754b.

The insulating layer 758 is provided over the conductive layer 756, the insulating layer 757a, the insulating layer 757b, the conductive layer 754a, and the conductive layer 754b.

The insulating layer 758 can be a layer of a material that can be used for the insulating layer 602 (a) shown in FIG. 5A, for example. The insulating layer 758 may be formed by stacking layers of any of materials that can be used for the insulating layer 759. The insulating layer 758 functions as a protective layer suppressing entry of an impurity.

The insulating layer 759 is provided over the insulating layer 758.

The insulating layer 759 can be a layer of a material that can be used for the insulating layer 602 (a) shown in FIG. 5A, for example. The insulating layer 759 may be formed by stacking layers of any of materials that can be used for the insulating layer 759.

The conductive layer 760a is electrically connected to the conductive layer 754a through an opening formed in the insulating layer 758 and the insulating layer 759. The conductive layer 760a functions as the source or the drain of the transistor including an oxide semiconductor layer.

The conductive layer 760b is electrically connected to the conductive layer 754b through an opening formed in the insulating layer 758 and the insulating layer 759. The conductive layer 760b functions as the source or the drain of the transistor including an oxide semiconductor layer.

Each of the conductive layers 760a and 760b can be, for example, a layer of a material that can be used for the conductive layers 605a (a) and 605b (a) shown in FIG. 5A. The conductive layers 760a and 760b may be formed by stacking layers of any of materials that can be used for the conductive layers 760a and 760b.

The above is the description of the structural example of the semiconductor circuit shown in FIG. 7.

As described with reference to FIG. 7, in the structural example of the semiconductor circuit in this embodiment, the semiconductor circuit is formed by stacking transistors which include semiconductor layers formed using different materials, whereby the circuit area can be reduced.

This embodiment can be combined with any of the other embodiments disclosed in this specification as appropriate.

Embodiment 4

In this embodiment, oxide materials that can be used in any of the above embodiments will be described with reference to FIGS. 8A to 8E, FIGS. 9A to 9C, and FIGS. 10A to 10C.

A transistor including a CAAC-OS described as an example in this embodiment can have the field effect mobility higher than that of a transistor including an amorphous oxide semiconductor. For example, the transistor including a CAAC-OS can operate in a higher frequency band.

In this embodiment, an oxide semiconductor including a crystal with c-axis alignment, which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis). Such an oxide semiconductor is also referred to as a c-axis aligned crystalline oxide semiconductor (CAAC-OS).

In a broad sense, a CAAC-OS means a non-single-crystal oxide semiconductor including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC-OS is not a single crystal, but does not consist only of an amorphous portion. Although the CAAC-OS includes a crystallized portion (crystal portion), a boundary between one crystal portion and another crystal portion is not clear in some cases.

Nitrogen may be substituted for part of oxygen included in the CAAC-OS. The c-axes of the crystal portions included in the CAAC-OS may be aligned in one direction (e.g., a direction perpendicular to a surface of a substrate over which the CAAC-OS is formed or a top surface of the CAAC-OS). Alternatively, the normals of the a-b planes of the individual crystal portions included in the CAAC-OS may be aligned in one direction (e.g., a direction perpendicular to a surface of a substrate over which the CAAC-OS is formed or a surface of the CAAC-OS, or the like).

The CAAC-OS can be a conductor, a semiconductor, or an insulator depending on its composition or the like. The CAAC-OS transmits or does not transmit visible light depending on its composition or the like.

As an example of such a CAAC-OS, there is an oxide semiconductor which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

The CAAC-OS film is not completely single crystal nor completely amorphous. The CAAC-OS film is an oxide semiconductor film with a crystal-amorphous mixed phase structure where crystal portions and amorphous portions are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility due to the grain boundary is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal portion may be different from those of another crystal portion. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal portion is the direction parallel to a normal vector of the surface where the CAAC-OS film is formed or a normal vector of the surface of the CAAC-OS film. The crystal portion is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

The CAAC-OS will be described in detail with reference to FIGS. 8A to 8E, FIGS. 9A to 9C, and FIGS. 10A to 10C. In FIGS. 8A to 8E, FIGS. 9A to 9C, and FIGS. 10A to 10C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 8A to 8E, O surrounded by a circle represents a tetracoordianate O atom and a double circle represents a tricoordinate O atom.

Figure 8A:
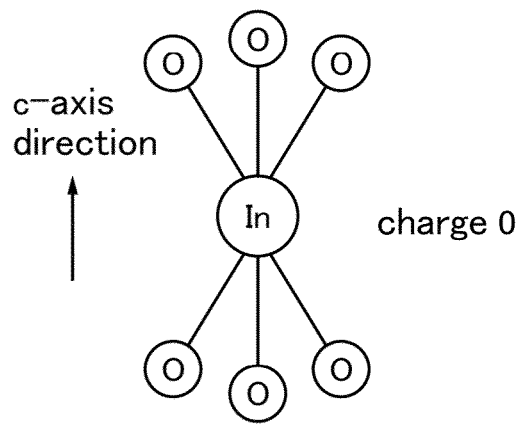
FIGS. 8A to 8E show crystal structures of an oxide material.

FIG. 8A shows a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 8A is actually an octahedral structure, but is shown as a planar structure for simplicity. Note that three tetracoordinate O atoms exist in each of an upper half and a lower half in FIG. 8A. In the small group shown in FIG. 8A, charge is 0.

Figure 8D:
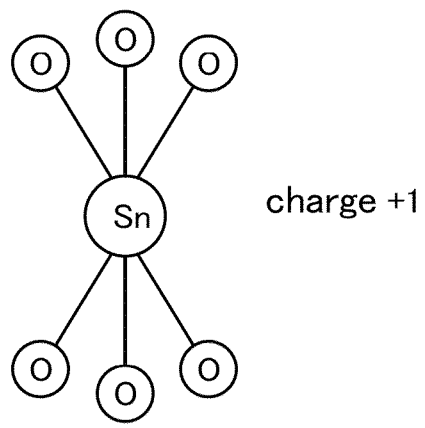
Figure 8B:
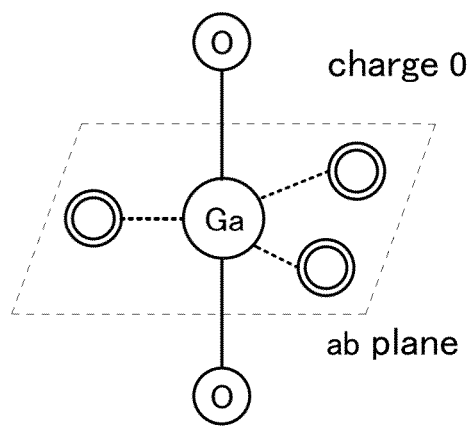

FIG. 8B shows a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 8B. An In atom can also have the structure shown in FIG. 8B because an In atom can have five ligands. In the small group shown in FIG. 8B, charge is 0.

Figure 8E:
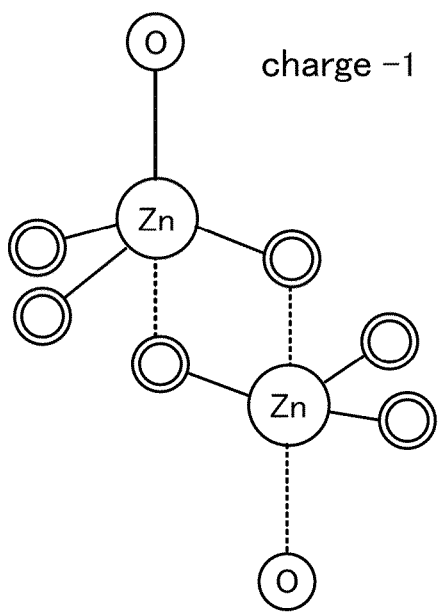
Figure 8C:
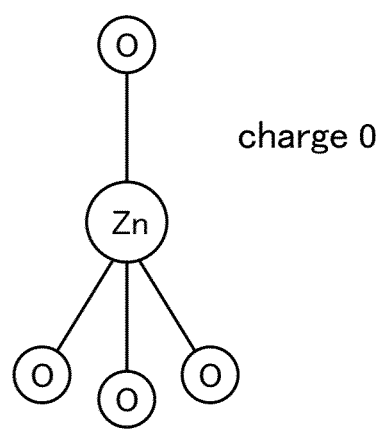

FIG. 8C shows a structure including one tetracoordinate Zn atom and four tetracoordinate O atoms proximate to the Zn atom. In FIG. 8C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 8C. In the small group shown in FIG. 8C, charge is O.

FIG. 8D shows a structure including one hexacoordinate Sn atom and six tetracoordinate O atoms proximate to the Sn atom. In FIG. 8D, three tetracoordinate O atoms exist in each of an upper half and a lower half In the small group shown in FIG. 8D, charge is +1.

FIG. 8E shows a small group including two Zn atoms. In FIG. 8E, one tetracoordinate O atom exists in each of an upper half and a lower half. In the small group shown in FIG. 8E, charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 8A each have three proximate In atoms in the downward direction, and the three O atoms in the lower half each have three proximate In atoms in the upward direction. The one O atom in the upper half with respect to the pentacoordinate Ga atom in FIG. 8B has one proximate Ga atom in the downward direction, and the one O atom in the lower half has one proximate Ga atom in the upward direction. The one O atom in the upper half with respect to the tetracoordinate Zn atom in FIG. 8C has one proximate Zn atom in the downward direction, and the three O atoms in the lower half each have three proximate Zn atoms in the upward direction. Similarly, the number of the tetracoordinate O atoms below the metal atom is equal to the number of the metal atoms proximate to and above each of the tetracoordinate O atoms. Since the coordination number of the tetracoordinate O atom is four, the sum of the number of the metal atoms proximate to and below the O atom and the number of the metal atoms proximate to and above the O atom is four. Therefore, when the sum of the number of tetracoordinate O atoms above a metal atom and the number of tetracoordinate O atoms below another metal atom is four, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom having the above coordination number is bonded to another metal atom having the above coordination number through a tetracoordinate O atom in the c-axis direction. In addition to the above, a medium group can be formed in a different manner by combining a plurality of small groups so that the total charge of the layered structure is 0.

Figure 9A:
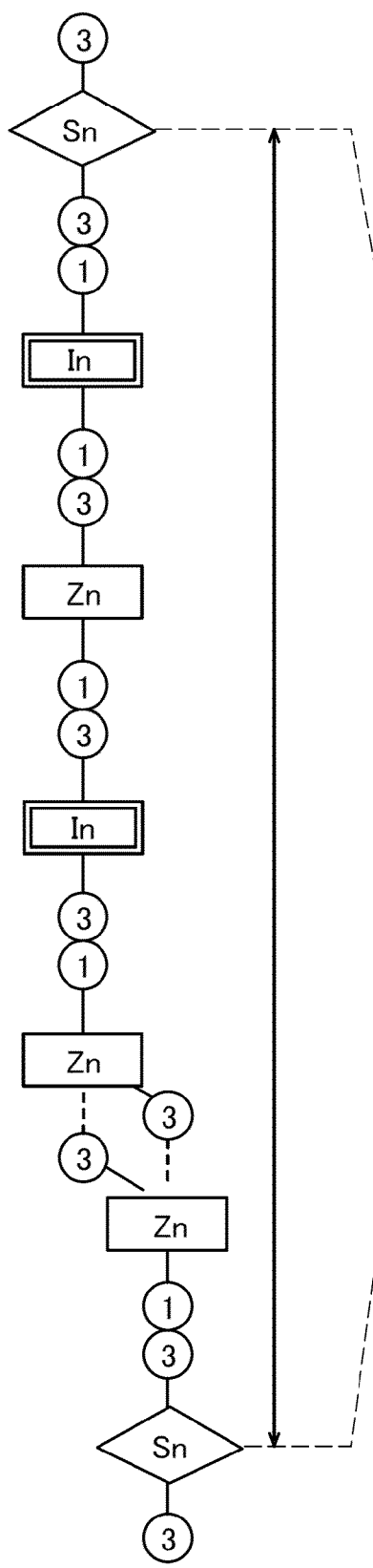
FIGS. 9A to 9C show a crystal structure of an oxide material.
Figure 9B:
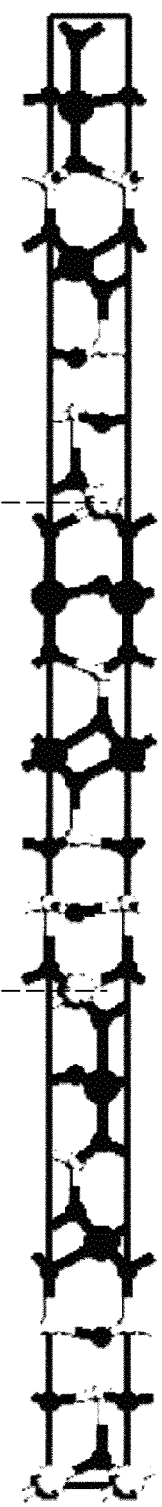
Figure 9C:
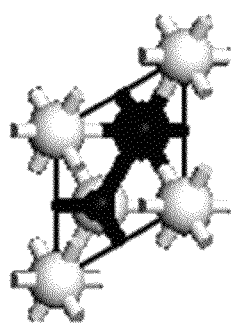

FIG. 9A shows a model of a medium group included in a layered structure of an In—Sn—Zn—O system. FIG. 9B shows a large group including three medium groups. Note that FIG. 9C shows an atomic arrangement in the case where the layered structure in FIG. 9B is observed from the c-axis direction.

In FIG. 9A, for simplicity, a tricoordinate O atom is omitted and tetracoordinate O atoms are shown by a circle; the number in the circle shows the number of tetracoordinate O atoms. For example, three tetracoordinate O atoms existing in each of an upper half and a lower half with respect to a Sn atom are denoted by circled 3. Similarly, in FIG. 9A, one tetracoordinate O atom existing in each of an upper half and a lower half with respect to an In atom is denoted by circled 1. FIG. 9A also shows a Zn atom proximate to three tetracoordinate O atoms in an upper half and one tetracoordinate O atom in a lower half, and a Zn atom proximate to one tetracoordinate O atom in an upper half and three tetracoordinate O atoms in a lower half.

In the medium group included in the layered structure of an In—Sn—Zn—O system in FIG. 9A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, charge for one bond of a tricoordinate O atom and charge for one bond of a tetracoordinate O atom can be assumed to be −0.667 and −0.5, respectively. For example, charge of a (hexacoordinate or pentacoordinate) In atom, charge of a (tetracoordinate) Zn atom, and charge of a (pentacoordinate or hexacoordinate) Sn atom are +3, +2, and +4, respectively. Accordingly, charge in a small group including a Sn atom is +1. Therefore, charge of −1, which cancels +1, is needed to form a layered structure including a Sn atom. As a structure having charge of −1, the small group including two Zn atoms as shown in FIG. 8E can be given. For example, with one small group including two Zn atoms, charge of one small group including a Sn atom can be cancelled, so that the total charge of the layered structure can be 0.

When the large group shown in FIG. 9B is repeated, a crystal of an In—Sn—Zn—O system ($In_2SnZn_3O_8$) can be obtained. Note that the layered structure of an In—Sn—Zn—O system which is obtained can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O system oxide; a three-component metal oxide such as an In—Ga—Zn—O system oxide (also referred to as IGZO), an In—Al—Zn—O system oxide, a Sn—Ga—Zn—O system oxide, an Al—Ga—Zn—O system oxide, a Sn—Al—Zn—O system oxide, an In—Hf—Zn—O system oxide, an In—La—Zn—O system oxide, an In—Ce—Zn—O system oxide, an In—Pr—Zn—O system oxide, an In—Nd—Zn—O system oxide, an In—Sm—Zn—O system oxide, an In—Eu—Zn—O system oxide, an In—Gd—Zn—O system oxide, an In—Tb—Zn—O system oxide, an In—Dy—Zn—O system oxide, an In—Ho—Zn—O system oxide, an In—Er—Zn—O system oxide, an In—Tm—Zn—O system oxide, an In—Yb—Zn—O system oxide, or an In—Lu—Zn—O system oxide; a two-component metal oxide such as an In—Zn—O system oxide, a Sn—Zn—O system oxide, an Al—Zn—O system oxide, a Zn—Mg—O system oxide, a Sn—Mg—O system oxide, an In—Mg—O system oxide, or an In—Ga—O system oxide; and the like.

Figure 10A:
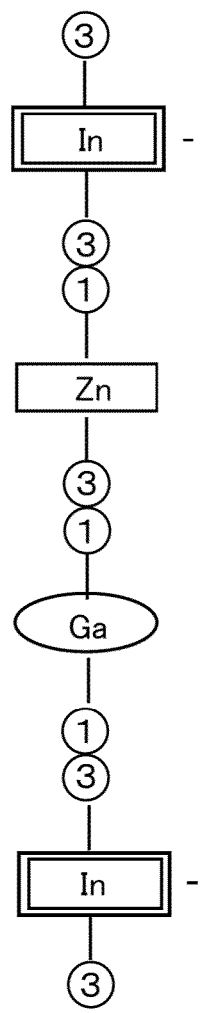
FIGS. 10A to 10C show a crystal structure of an oxide material.

As an example, FIG. 10A shows a model of a medium group included in a layered structure of an In—Ga—Zn—O system.

In the medium group included in the layered structure of an In—Ga—Zn—O system in FIG. 10A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded to form a large group.

Figure 10B:
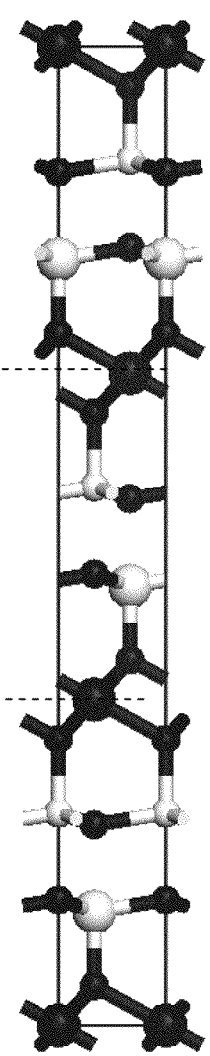
Figure 10C:
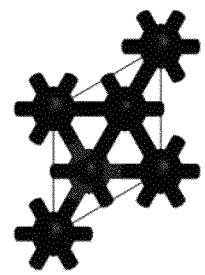
Figure 11:
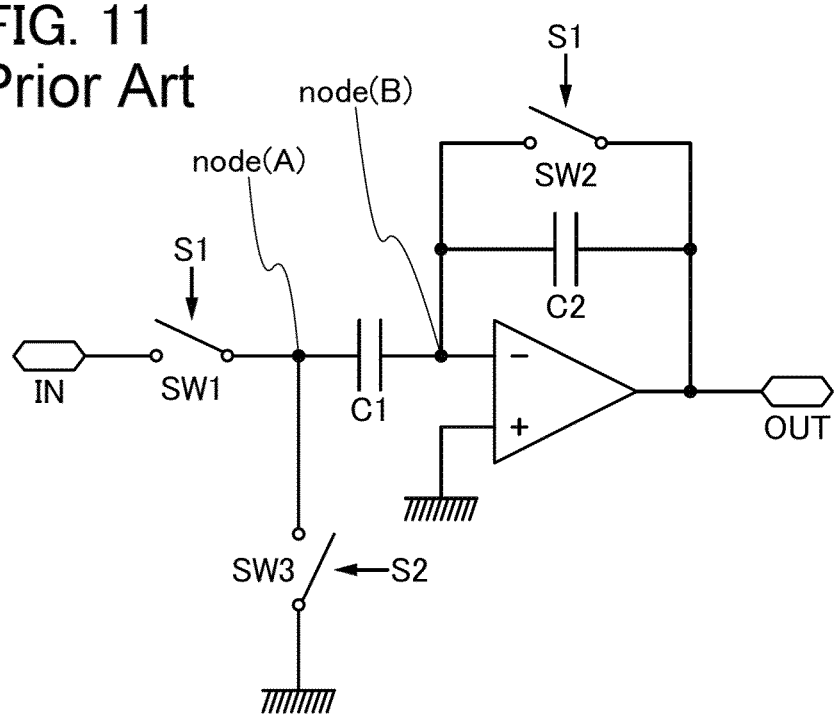
FIG. 11 shows a conventional switched capacitor amplifier circuit.

FIG. 10B shows a large group including three medium groups. Note that FIG. 10C shows an atomic arrangement in the case where the layered structure in FIG. 10B is observed from the c-axis direction.

Here, since charge of a (hexacoordinate or pentacoordinate) In atom, charge of a (tetracoordinate) Zn atom, and charge of a (pentacoordinate) Ga atom are +3, +2, +3, respectively, charge of a small group including any of an In atom, a Zn atom, and a Ga atom is 0. As a result, the total charge of a medium group having a combination of such small groups is always 0.

In order to form the layered structure of an In—Ga—Zn—O system, a large group can be formed using not only the medium group shown in FIG. 10A but also a medium group in which the arrangement of the In atom, the Ga atom, and the Zn atom is different from that in FIG. 10A.

When the large group shown in FIG. 10B is repeated, a crystal of an In—Ga—Zn—O system can be obtained. Note that the layered structure of an In—Ga—Zn—O system which is obtained can be expressed as a composition formula, $InGaO_3(ZnO)_n$ (n is a natural number).

With the use of a transistor including a CAAC-OS, the field effect mobility can be higher than that in a transistor including an amorphous oxide semiconductor. Such a transistor can operate in high frequency band, so that the transistor can be used for a CPU or the like, for example.

This embodiment can be combined with any of the other embodiments disclosed in this specification as appropriate.

This application is based on Japanese Patent Application serial No. 2011-101940 filed with Japan Patent Office on Apr. 28, 2011, the entire contents of which are hereby incorporated by reference.

What is claimed is:

1. A semiconductor circuit comprising:
   an operational amplifier circuit;
   a first switching element which is electrically connected to one input terminal of the operational amplifier circuit through a first capacitor;
   a second capacitor which is electrically connected between the one input terminal and an output terminal of the operational amplifier circuit;
   a second switching element which is electrically connected between the one input terminal and the output terminal of the operational amplifier circuit; and
   a third switching element comprising one electrode which is electrically connected between the first switching element and the first capacitor and the other electrode to which a reference voltage is input,
   wherein the reference voltage is input to the other input terminal of the operational amplifier circuit,
   wherein each of the first switching element and the second switching element comprises a field-effect transistor whose leakage current in an off state is less than or equal to $1\times10^{-17}$ A per channel width of 1 μm, and
   wherein the first switching element and the second switching element are provided over the third switching element.

2. The semiconductor circuit according to claim 1, wherein in the field-effect transistor, an oxide semiconductor is comprised in a semiconductor layer in which a channel is formed.

3. The semiconductor circuit according to claim 1 is a switched capacitor amplifier circuit which amplifies voltage amplitude of a continuous time signal input as an input signal and outputs a discrete time signal as an output signal.

4. The semiconductor circuit according to claim 2, wherein the oxide semiconductor has a band gap greater than or equal to 2.0 eV.

5. The semiconductor circuit according to claim 1, wherein the third switching element is a field-effect transistor comprising silicon as a semiconductor element.

6. The semiconductor circuit according to claim 1, wherein the third switching element is a field-effect transistor comprising an oxide semiconductor as a semiconductor material.

* * * * *